US009570535B2

(12) United States Patent
Ouyang et al.

(10) Patent No.: US 9,570,535 B2
(45) Date of Patent: Feb. 14, 2017

(54) INTEGRATED MAGNETICS COMPONENT

(75) Inventors: Ziwei Ouyang, Holte (DK); Michael A. E. Andersen, Helsinge (DK); Zhe Zhang, Kgs. Lyngby (DK)

(73) Assignee: Danmarks Tekniske Universitet, Kgs. Lyngby (DK)

( * ) Notice: Subject to any disclaimer, the term of this patent is extended or adjusted under 35 U.S.C. 154(b) by 173 days.

(21) Appl. No.: 14/344,621

(22) PCT Filed: Sep. 6, 2012

(86) PCT No.: PCT/EP2012/067422
§ 371 (c)(1),
(2), (4) Date: Jul. 7, 2014

(87) PCT Pub. No.: WO2013/037696
PCT Pub. Date: Mar. 21, 2013

(65) Prior Publication Data
US 2014/0340940 A1 Nov. 20, 2014

Related U.S. Application Data

(60) Provisional application No. 61/534,202, filed on Sep. 13, 2011.

(30) Foreign Application Priority Data

Sep. 13, 2011 (EP) .................................... 11181106

(51) Int. Cl.
*H01F 27/28* (2006.01)
*H01L 49/02* (2006.01)
(Continued)

(52) U.S. Cl.
CPC .............. *H01L 28/10* (2013.01); *H01F 27/28* (2013.01); *H01F 30/06* (2013.01); *H01F 38/00* (2013.01);
(Continued)

(58) Field of Classification Search
CPC ........................................... H01F 27/00–27/35
(Continued)

(56) References Cited

U.S. PATENT DOCUMENTS

| 4,930,059 A | 5/1990 | Rutt |
| 2009/0230776 A1 | 9/2009 | Ochi et al. |
| 2010/0246214 A1 | 9/2010 | Nakahori |

FOREIGN PATENT DOCUMENTS

| JP | 2001-135531 | 5/2001 |
| JP | S55-138215 | 5/2001 |

(Continued)

OTHER PUBLICATIONS

Liu and Chen; A Systematic Approach to Synthesizing Multi-Input DC-DC Converters; IEEE Transactions on Power Electronics, vol. 24, No. 1, Jan. 2009.

(Continued)

*Primary Examiner* — Tuyen Nguyen
(74) *Attorney, Agent, or Firm* — Peter A. Nieves; Sheehan Phinney Bass & Green PA

(57) ABSTRACT

The present invention relates to an integrated magnetics component comprising a magnetically permeable core comprising a base member extending in a horizontal plane and first, second, third and fourth legs protruding substantially perpendicularly from the base member. First, second, third and fourth output inductor windings are wound around the first, second, third and fourth legs, respectively. A first input conductor of the integrated magnetics component has a first conductor axis and extends in-between the first, second, third and fourth legs to induce a first magnetic flux through a first flux path of the magnetically permeable core. A second input conductor of the integrated magnetics component has a second coil axis extending substantially perpendicularly to the first conductor axis to induce a second magnetic flux through a second flux path of the magnetically (Continued)

permeable core extending substantially orthogonally to the first flux path. Another aspect of the invention relates to a multiple-input isolated power converter comprising the integrated magnetics component.

18 Claims, 14 Drawing Sheets

(51) Int. Cl.
*H01F 30/06* (2006.01)
*H01F 38/00* (2006.01)
*H02M 3/335* (2006.01)
*H02M 3/28* (2006.01)
*H02M 1/00* (2006.01)

(52) U.S. Cl.
CPC ......... *H02M 3/335* (2013.01); *H02M 3/33546* (2013.01); *H02M 3/285* (2013.01); *H02M 2001/0064* (2013.01)

(58) Field of Classification Search
USPC ................ 336/170–173, 210–215, 220–223
See application file for complete search history.

(56) References Cited

FOREIGN PATENT DOCUMENTS

| | | |
|---|---|---|
| JP | 2010-239797 | 10/2010 |
| JP | 2010-246364 | 10/2010 |
| JP | 2011-114957 | 6/2011 |
| WO | WO 2009/012778 A2 | 1/2009 |

OTHER PUBLICATIONS

Kobayashi, Matsuo and Sekine; Novel Solar-Cell Power Supply System Using a Multiple-Input DC-DC Converter; IEEE Transactions on Industrial Electronics, vol. 53, No. 1, Feb. 2006.

Matsuo, et al; Characteristics of the Multiple-Input DC-DC Converter; IEEE Transactions on Industrial Electronics, vol. 51, No. 3, Jun. 2004.

Yalamanchili and Ferdowsi; Review of Multiple Input DC-DC Converters for Electric and Hybrid Vehicles; Vehicle Power and Propulsion, 2005 IEEE Conference, dated Sep. 7-9, 2005.

Chen et al; Multi-Input DC/DC Converter Based on the Multiwinding Transformer for Renewable Energy Applications; IEEE T Ind Appl, vol. 38, No. 4, Jul./Aug. 2002.

Zhang et al; Study of the Multilevel Converters in DC-DC Applications; 2004 35th Annual IEEE Power Electronics Specialists Conference; Germany 2004.

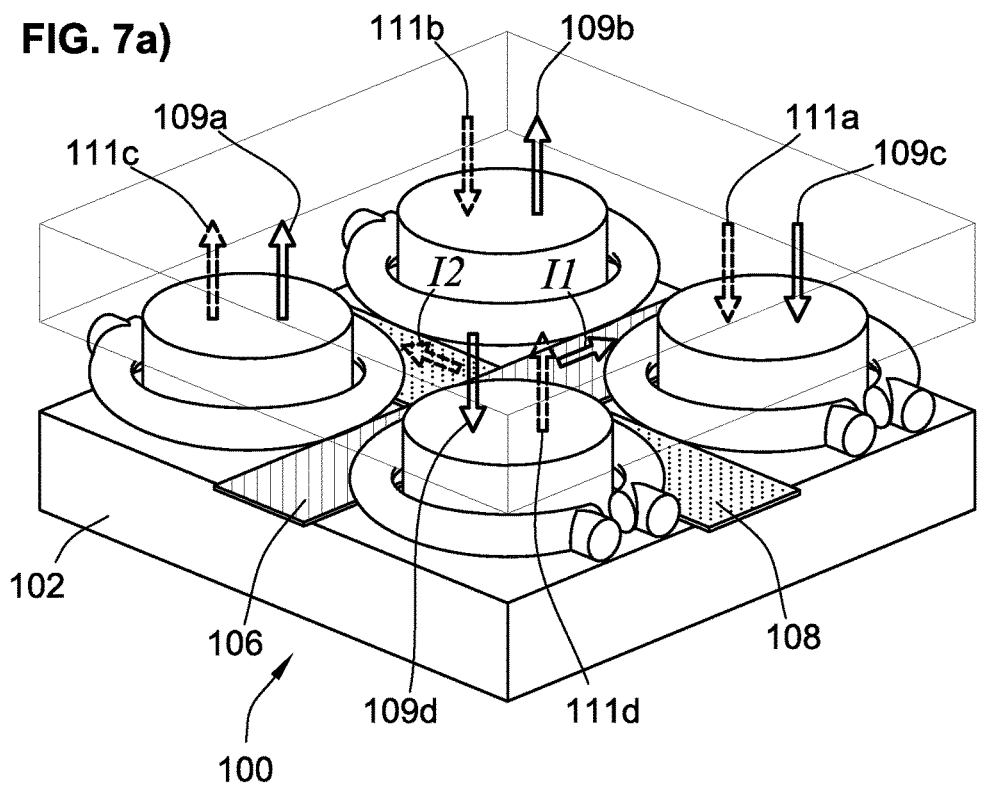
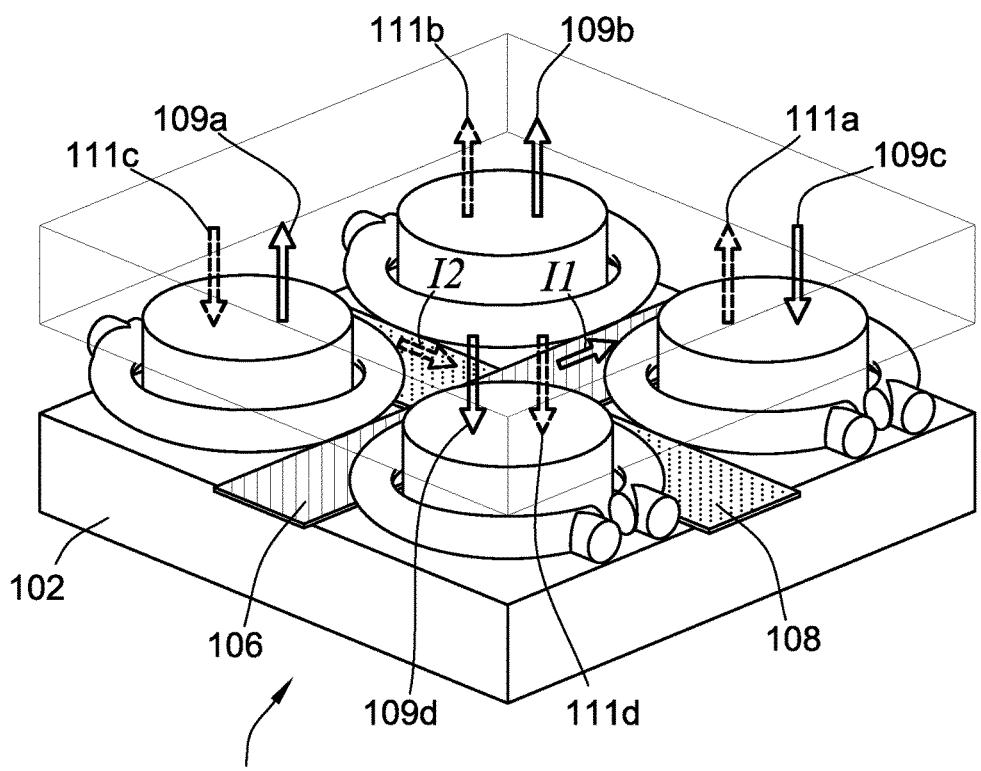

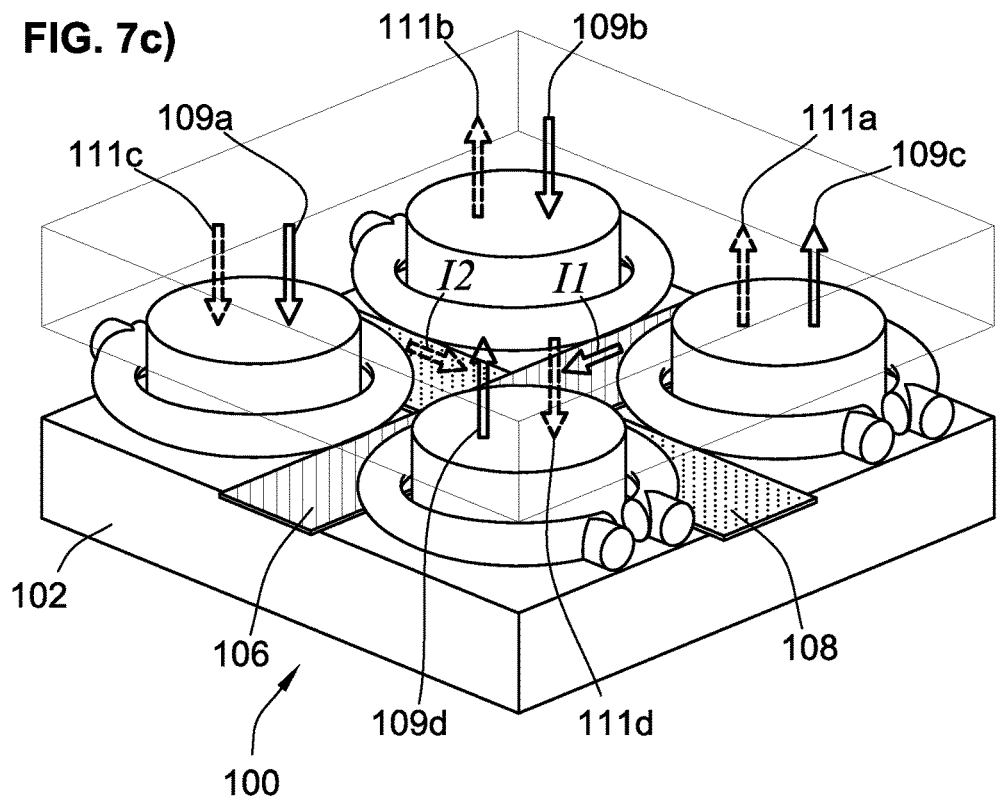
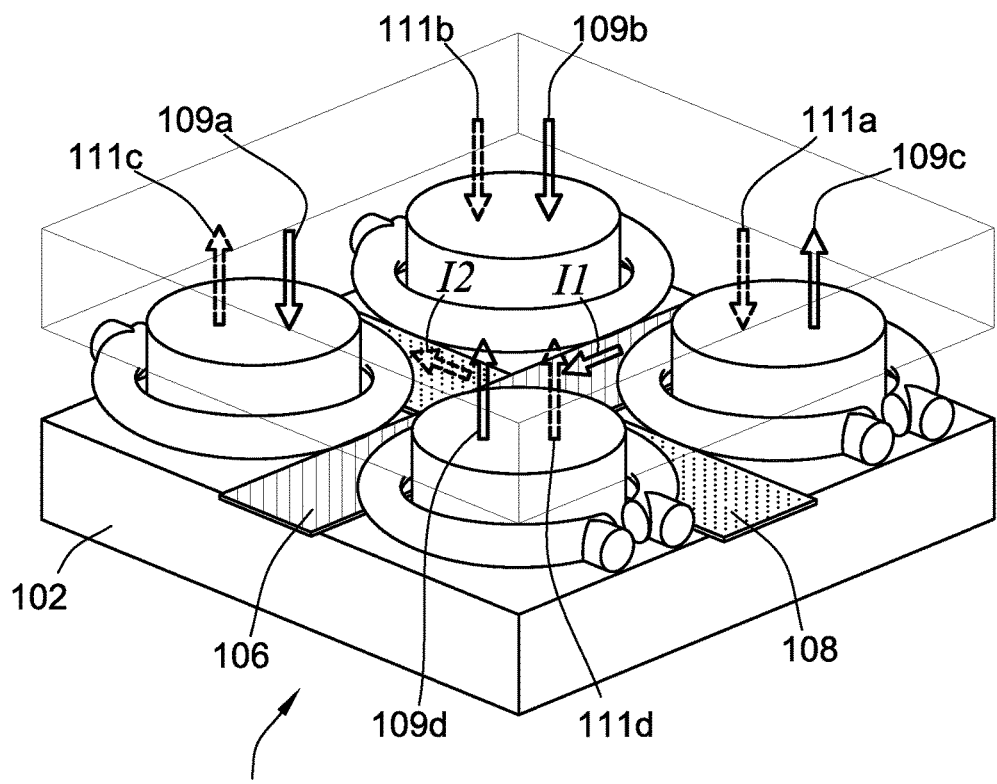

INTEGRATED MAGNETICS COMPONENT

The present invention relates to an integrated magnetics component comprising a magnetically permeable core comprising a base member extending in a horizontal plane and first, second, third and fourth legs protruding substantially perpendicularly from the base member. First, second, third and fourth output inductor windings are wound around the first, second, third and fourth legs, respectively. A first input conductor of the integrated magnetics component has a first coil axis and extends in-between the first, second, third and fourth legs to induce a first magnetic flux through a first flux path of the magnetically permeable core. A second input conductor of the integrated magnetics component has a second coil axis extending substantially perpendicularly to the first coil axis to induce a second magnetic flux through a second flux path of the magnetically permeable core extending substantially orthogonally to the first flux path. Another aspect of the invention relates to a multiple-input isolated power converter comprising the integrated magnetics component.

BACKGROUND OF THE INVENTION

In order to combine power generated from two or more input voltage or energy sources to get a DC output voltage, different circuit topologies of multi-input power converters have been proposed in recent years [1-4]. The input voltage or energy sources may for example comprise clean energy sources such as solar arrays, wind turbines, fuel cells and commercial ac power lines.

A common limitation of some known multiple-input power converters is that only one input power source is allowed to transfer power or energy to the output at a time to prevent power coupling effects. Recently, in order to overcome this limitation, it has been proposed to use multiple-input winding transformers based on flux additivity technology with phase-shifted PWM control. While this technology can transfer power from two or multiple different input voltage sources to the DC output and its associated load individually or simultaneously [5], reverse blocking diodes are required at the input drivers of the multi-input power converter. The reverse blocking diodes are needed to prevent a reverse power flow from one of the input voltage sources to another input voltage source through the coupled primary side of the transformer and through body diodes of semiconductor switches of the input drivers.

Without these reverse-blocking diodes, different input sources coupled to the multi-input power converter cannot deliver power to the load simultaneously. Some prior art approaches to overcome the problems associated with the coupling between the transformer input windings have relied on a shared low reluctance path or utilized flux cancellation mechanisms to decouple the input windings of a transformer [6]. In addition, higher current stress in low side MOSFETs of the input driver can be imposed due to a clamped voltage of the mutually coupled input inductor windings which causes a higher power loss.

Consequently, it would be advantageous to provide an integrated magnetics component with uncoupled input conductors for use in multiple-input power converters and other applications to allow multiple input power sources to be operated independently without compromising any functions of the power converter or require complex control or protection circuitry to be added to the input drivers.

SUMMARY OF THE INVENTION

A first aspect of the invention relates to an integrated magnetics component comprising:

a magnetically permeable core comprising a base member and a top member, the base member extending in a horizontal or first plane and comprises first, second, third and fourth legs protruding substantially perpendicularly from the base member. The top member is attached to opposite ends of the first, second, third and fourth legs relative to the base member. The integrated magnetics component additionally comprises first, second, third and fourth output inductor windings wound around the first, second, third and fourth legs, respectively. The integrated magnetics component also comprises a first input conductor extending in-between the first, second, third and fourth legs along a first conductor axis, said first input conductor configured to induce a first magnetic field orthogonally to the first conductor axis and extending through a first flux path of the magnetically permeable core. A second input conductor extends along a second conductor axis and is arranged to induce a second magnetic field orthogonally to the second conductor axis and extending through a second flux path of the magnetically permeable core. The second flux path extends substantially orthogonally to the first flux path.

The present invention is accordingly based on a new magnetic flux path decoupling concept which is useful in numerous applications such as multiple-input power converters e.g. boost power converters and buck power converters etc. The magnetic flux path decoupling concept is based on 2-dimensional (2D) or a 3-dimensional (3D) space orthogonal flux decoupling wherein the first and second flux paths extend substantially orthogonally to each other within the shared magnetically permeable core. The skilled person will appreciate that first flux path forms a first closed magnetic loop extending from the first input conductor through the base member, the first and second legs, the top member, the third and fourth legs and back to the first input conductor. Likewise, the second flux path forms a second closed magnetic loop extending from the second input conductor through the base member, the first and fourth legs, the top member, the second and third legs and back to the second input conductor. In this manner, an axis of the first closed magnetic loop extends substantially orthogonally to an axis of the second closed magnetic loop such that the second flux path extends substantially orthogonally to the first flux path despite that the magnetic flux portions running through the first, second, third and fourth legs may be parallel as explained in further detail below in connection with FIG. 3.

In a preferred embodiment, the magnetically permeable core comprises a new unusual geometry wherein the first, second, third and fourth legs are arranged in a substantially rectangular or quadratic pattern at the base member with the first, second, third and fourth legs situated at respective corners of the base member. In this embodiment, the first and second input conductors may be arranged in a cross-shaped layout with the first, second, third and fourth legs located in respective ones of four quadrant areas.

The skilled person will appreciate that a cross-sectional profile of each of the first, second, third and fourth legs may vary considerably depending on a particular application. The cross-sectional profile may e.g. be circular, elliptical, rectangular, pentagon, hexagon, heptagon, octagon etc. The shape of each of the first, second, third and fourth output inductor windings may be adapted to conform to anyone of these cross-sectional profiles of the legs so as to fit tightly around the leg in question. Furthermore, each of the first, second, third and fourth output inductor windings may comprise a single inductor winding or a plurality of full inductor windings.

In one embodiment, the first conductor axis and the second coil axis both extend in, or parallelly with, the horizontal plane. In one such embodiment, the first and second input conductors are arranged proximate to each other for example in abutment such that the first and second input conductors are abutted and overlapped in a central region of the base member.

In other embodiments, the first and second input conductors are vertically off-set (i.e. off-set in a direction parallelly with the first, second, third and fourth legs) such that the first or second input conductor is arranged in abutment with, or fastened to, the base member while the other input conductor is raised a certain distance above the base member towards the top member.

Each of the first and second input conductors may comprise a substantially straight segment or piece of electrically conductive wire. The electrically conductive wire may comprise an electrically conductive material such as a metallic material like copper and/or aluminium. Each of the first and second input conductors may comprise a flat strip of the electrically conductive material. Each of the first and second input conductors preferably comprises an electric insulation layer fully or partly covering the conductor. The electric insulation layer may leave end portions or segments of the input conductor uncovered to form first and second externally electrical terminals for connecting the input conductor to a suitable driver circuit. The flat strips of electrically conductive material may be arranged in abutment with the base member or in abutment with the top member. If the base member comprises an essentially flat upper surface, the flat strips of electrically conductive material may be fastened to the flat upper surface of the base member. The flat strips of electrically conductive material may be formed as straight strips forming part of respective inductor windings.

The first and second electrical terminals of the first input conductor preferably c arranged at opposite ends thereof and the second input conductor preferably also comprises first and second electrical terminals arranged at opposite ends thereof. The first and second electrical terminals may advantageously serve as externally accessible inputs of the first and second input conductors for establishing connection to electrical driver circuits such as a transistor based half-bridge or full-bridge driver. The half-bridge or full-bridge driver is may be adapted to supply phase-shifted PWM or PDM drive signals to the first and second input conductors.

According to an advantageous embodiment of the invention, the integrated magnetics component comprises a third input conductor extending in-between a diagonal pair of the first, second, third and fourth legs along a third conductor axis to induce a third magnetic field orthogonally to the third conductor axis. The third input conductor is arranged to generate the third magnetic field through a third flux path of the magnetically permeable core extending substantially orthogonally to the first flux path and substantially orthogonally to the second flux path of the magnetically permeable core. This embodiment of the invention is capable of supporting a three-input power converters capable of transferring power from three different input voltage sources to the DC output voltage individually or simultaneously. The feature that the third magnetic flux path extends substantially orthogonally to both the first and second magnetic flux paths provides a 3-dimensional (3D) space orthogonal flux decoupling wherein the first, second and third flux paths extend substantially orthogonally to each other within the shared magnetically permeable core.

In one embodiment, the top member comprises fifth, sixth, $7^{th}$ and $8^{th}$ legs extending parallelly to the horizontal plane. This is preferably accomplished by placing a through-going aperture or cut-out of appropriate dimensions in the top member leaving 4 vertices that form respective ones of the fifth, sixth, $7^{th}$ and $8^{th}$ legs. In one such embodiment, the magnetically permeable core comprises a hollow cubic structure wherein the first, second, third, fourth, fifth, sixth, $7^{th}$ and $8^{th}$ legs form respective vertices of the hollow cubic structure. In the latter embodiment, the base member may also comprise a corresponding central through going cut-out or aperture.

In a preferred embodiment, the first, second, third and fourth legs are arranged at respective positions of the base member such that first and second substantially orthogonally extending passages or trenches are formed at a surface of the base member. The first and second input conductors are projecting through the first trench and the second trench, respectively. Bottom surfaces of the first and second trenches may be essentially plane and arranged in the horizontal plane such that each of the trenches or passages are enclosed by the first, second, third and fourth legs.

In one embodiment, the base member may comprise a first essentially flat quadratic or rectangular plate with the first, second, third and fourth legs arranged at respective corners of the base member. The top member may alternatively, or additionally, comprise a second essentially flat rectangular plate. The first and second plates are preferably arranged substantially parallel to each other. The flat quadratic or rectangular base and top plates and the first, second, third and fourth legs are magnetically and mechanically coupled to each other. In one embodiment wherein both of the top and base members comprise the flat quadratic or rectangular plates, each of the first, second, third and fourth legs may be flush mounted with respective edges of the rectangular or quadratic plates. The latter embodiment may provide a regular cubic shape of the magnetically permeable core.

In other embodiments, the base member may have a shape of a flat circular, elliptical, pentagon, hexagon, heptagon, octagon etc. structure wherein the first, second, third and fourth legs are arranged at respective circumferential edges of the structure.

According to yet another preferred embodiment, the first input conductor forms part of a first input inductor winding wound around a first pair of adjacent legs of the first, second, third and fourth legs; and the second input conductor forms part of a second input inductor winding wound around a second pair of adjacent legs of the first, second, third and fourth legs.

Preferably, each of the first and second inductor windings extend exclusively above the base member or above the top member in, or parallel to, the horizontal plane. In this embodiment, each of the first and second inductor winding possess a horizontally folded geometry or layout encircling the first pair of adjacent legs or encircling the second pair of adjacent legs as mentioned above. In this embodiment, the first and second input inductor windings possess a horizontally folded geometry or layout. A significant advantage of this embodiment is that the first and second input conductor windings can easily be integrated with standard types of stiff or flexible printed circuit boards (PCBs). Other components of the power converter can be integrated on the PCB together with the inductor windings such that effective modularization of the power converter is enabled.

The first and second input inductor windings may comprise a single or a plurality of full inductor winding(s). The choice of the exact number of inductor windings on each of the first and second inductor windings depends on a multitude of design considerations of the integrated magnetics component in question and the associated power converter. The inductor windings will typically depend on factors such as dual-input or triple-input architecture of the power converter, primary to secondary winding ratio and the desired step-up or step-down factor of the power converter etc.

Furthermore, power converter design parameters like drive signal modulation or switching frequency, input and output voltage levels, output power level and power efficiency, etc. are typically also relevant characteristics for determining the number of windings of each of the first and second induct windings.

However, in a number of useful embodiments, each of the first and second input inductor windings comprises between 2 and 50 individual full windings and each of the first, second, third and fourth output inductor windings comprises between 2 and 50 individual windings In another embodiment, each of the first and second input conductors may form part of respective U-shaped input inductor windings. The U-shaped inductor winding is a vertically folded structure which comprises first and second substantially parallel and vertically aligned winding legs. The first winding leg extends in-between the first, second, third and fourth legs, and preferably in abutment with the upper surface of the base member, similarly to the arrangement of the first leg of the previously discussed horizontally folded input inductor winding geometry. However, in the present embodiment, the second winding leg is arranged below, and preferably in abutment with, the lower surface of the base member. Hence, the length of a bridging portion coupling the first and second winding legs together may correspond approximately to a thickness of the base member. The first and second legs of the second U-shaped input inductor winding are arranged orthogonally to the first and second legs, respectively, of the second U-shaped input inductor winding.

Each of the first and second U-shaped inductor windings may comprise a flat ribbon or strip of electrically conductive material which may be attached to the base member by gluing or similar processes.

According to a preferred embodiment of the invention, the first input conductor is configured to generate a magnetic flux in a first direction through a first pair of adjacent legs arranged on a first side of the first input conductor and an oppositely directed magnetic flux through a second pair of adjacent legs arranged on a second and opposite side of the first input conductor. In addition, the second input conductor is configured to generate a magnetic flux in a second direction through a first pair of adjacent legs arranged on a first side of the second input conductor and an oppositely directed magnetic flux through a second pair of adjacent legs arranged on a second and opposite side of the second input conductor. The magnetic fluxes are induced by respective flows of input currents through the first and second input conductors and since the current in each input conductor can flow in two different directions four different input current states are created. In each current state, a resulting magnetic flux through each of the first, second, third and fourth legs is determined by contributions from both the first magnetic flux and the second magnetic flux. This implies that output voltage induced in each of the first, second, third and fourth output inductor windings likewise is determined by the contributions from both of the first and second input currents. This property leads to a new and highly flexible way of using phase control between first and second pulse width modulated drive signals, applied to the first and second input conductors, respectively, for controlling a DC output voltage of a multiple-input power converter employing the present integrated magnetics component as described below in further detail.

A second aspect of the present invention therefore relates to a multiple-input isolated power converter comprising an integrated magnetics component according to any of the above-described embodiments thereof. The multiple-input isolated power converter further comprises a first input driver electrically coupled to the first input conductor to supply a first drive signal thereto and a second input driver electrically coupled to the second input conductor to supply a second drive signal thereto. The output inductor windings of a first pair of diagonal legs are coupled electrically to a first output rectification circuit and the output inductor windings of a second pair of diagonal legs are coupled electrically to a second output rectification circuit. The first and second output rectification circuits are preferably coupled in parallel to a DC output voltage node or terminal such that input power delivered through both the first input driver and the second input driver are transferred to a common DC output voltage.

In one embodiment of the multiple-input isolated power converter, the output inductor windings of the first pair of diagonal legs are connected in series and the output inductor windings of the second pair of diagonal legs are connected in series. The previously described 2D or 3D orthogonal flux decoupling of the first and second input conductors (and possibly third input conductor) allow these to be operated independently such that the first and second input drivers can be coupled to a common electrical potential like ground. The skilled person will understand that the present multiple-input isolated power converter can have a variety of different topologies such as a boost or a buck topology or configuration.

A third aspect of the present invention relates to a method of controlling a DC output voltage of the multiple-input isolated power converter described above, the method comprising steps of:
generating a first a pulse width modulated drive signal having a first phase angle on the first input conductor,
generating a second pulse width modulated drive signal having a second phase angle on the second input conductor,
adjusting a phase angle difference between the first and second phase angles to control the DC output voltage.
The method may comprise of a further step of:
adjusting a duty cycle of the first pulse width modulated drive signal and/or a duty cycle of the second pulse width modulated drive signal to adjust the DC output voltage. The ability to control the DC output voltage either by adjusting the duty cycle, adjusting the phase angle difference or adjusting both leads to an extremely flexible way of controlling the DC output voltage with numerous benefits such as the provision of wider input and/or output voltage ranges of the multiple-input isolated power converter. Consequently, the same isolated power converter can be readily adapted to a broad variety of applications and therefore reduces the required number of variants of a given power converter topology, lowering assembly costs, component costs, stock costs etc. The flexible adaptation offered by the present multiple-input isolated power converter is particularly well-suited for power conversion in connection with clean energy sources like photovoltaic cells which often output a wide range of different voltages.

BRIEF DESCRIPTION OF THE DRAWINGS

Preferred embodiments of the invention will be described in more detail in connection with the appended drawings, in which.

DETAILED DESCRIPTION OF PREFERRED EMBODIMENTS

The embodiments described in detail below are particularly well-suited for application in isolated boost power converters providing DC voltage amplification or step-up. However, the skilled person will understand that the below described integrated magnetics component embodiments are highly useful for other types of applications such as buck type power converters and multi-coupled inductors with variable coupling coefficients.

Figure 1:
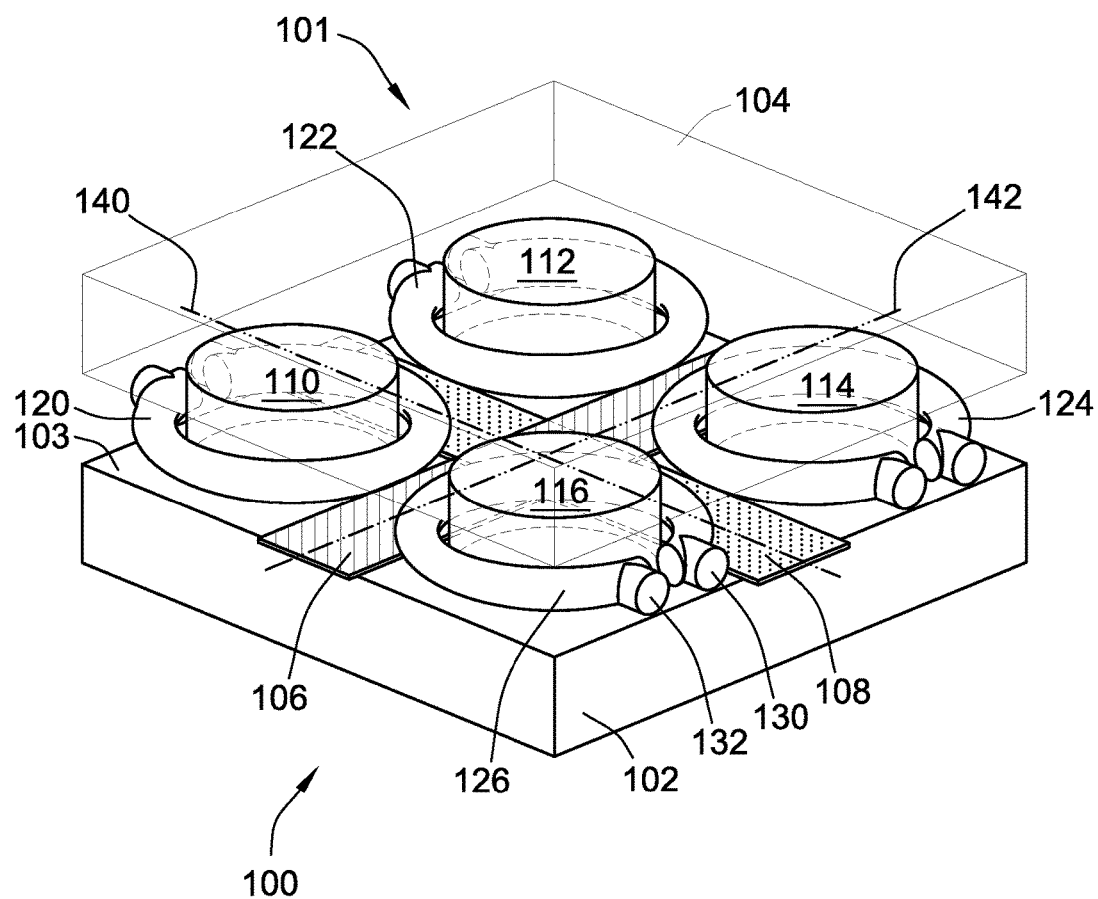
FIG. 1 shows an assembled view of an integrated magnetics component in accordance with a first embodiment of the invention.

FIG. 1 shows an assembled perspective view of an integrated magnetics component 100 in accordance with a first embodiment of the invention. The integrated magnetics component 100 comprises a magnetically permeable core 101 comprising a base member 102 and a top member 104. The base member 102 comprises a first leg 110, a second leg 112, a third leg 114 and fourth leg 116 all protruding substantially perpendicularly from the base member 102 to a lower surface of the top member such that the top member is attached to opposite ends of the first, second, third and fourth legs, 110, 112,114 and 116, respectively, relative to the base member 102. The attachment between the opposite ends of the first, second, third and fourth legs, 110, 112,114 and 116, respectively, and the top member may be provided in numerous ways such as by soldering, gluing, welding, press-fitting and the attachment mechanism preferably ensures good magnetic coupling between the top member 104 and each of the legs 110, 112,114 and 116. The integrated magnetics component 100 furthermore comprises a first output inductor winding 120, a second output inductor winding 122, a third output inductor winding 124 and a fourth output inductor winding 126 wound around the first, second, third and fourth legs, respectively. The fourth output inductor winding 126 comprises a pair of electrical terminals 130, 132 at each end of the output winding 126 and each of the first, second and third output inductor windings 120,122 and 124, respectively, comprises a similar pair of electrical terminals (not shown). Each of the first, second third and fourth output inductor windings is formed as a single full winding in the present embodiment of the invention but the skilled person will understand that each of the output inductor windings 120,122, 124 and 126, respectively, may comprise a plurality of full turn windings. The integrated magnetics component 100 furthermore comprises a first input conductor or primary side conductor 106 is a straight electrical wire formed as a flat ribbon or strip of electric conductive material extending in-between the first, second, third and fourth legs, 110, 112, 114 and 116, respectively. The first input conductor 106 is adapted to induce a first magnetic field orthogonally to the first conductor axis 142 when input current flows through the first input conductor 106 in accordance with the well-known right hand rule. The first magnetic field induces magnetic flux running through a first magnetic flux path or flux path of the magnetically permeable core 101. The generation and arrangement of the first flux path is discussed in further detail below in connection with FIG. 3 and FIGS. 7a)-d). Each end of the first input conductor 106 comprises an electrical termination or terminal (not shown) allowing electrical driver circuits such as a transistor based half-bridge or full-bridge driver to establish electrical connection to the conductor 106 and supply a drive signal thereto. A second straight input conductor or primary side conductor 108 extends substantially perpendicularly to the first input conductor 106. As the first input conductor 106, the second input conductor 108 is also formed as a straight flat ribbon of electric conductive material extending in-between the first, second, third and fourth legs, 110, 112,114 and 116, respectively, albeit in an orthogonal direction of the base member 102. The first input conductor 106 and the second input conductor 108 are accordingly arranged to form a cross-shaped conductor geometry arranged in abutment with, or close, to an upper substantially flat surface 103 of the base member. The skilled person will appreciate that the each of the first and second input conductors 106, 108 may possess alternative shapes in other embodiments of the invention such as a round, quadratic or cylindrical cross-sectional profile instead of a rectangular profile of the depicted flat ribbon. The first input conductor 106 and the second input conductor 108 have an overlap region situated substantially in a central region of the upper surface 103 of the base member. The first and second input conductors 106, 108, respectively, may comprise material with high electrical conductivity such as copper, aluminium or various alloys etc. The first and second input conductors may comprise wire designs like litz wire or other special winding arrangements aimed at reducing eddy current effects at high operational frequencies of the input drive signals applied to the first and second input conductors. Consequently, such special winding arrangements can reduce power loss in the input and/or output inductor windings of the integrated magnetics component and improving overall power conversion efficiency of the power converter in a beneficial manner.

The first and second inductor windings 106, 108, respectively, are preferably each coated with an electrically insulating layer to prevent short circuits between the first and second conductors or between each of these and the base member 102. The second input conductor 108 is adapted to induce a second magnetic field orthogonally to the second conductor axis 140 when input current flows through the second input conductor 108 in accordance with the well-known right hand rule. The second magnetic field induces magnetic flux through a second flux path of the magnetically permeable core extending substantially orthogonally to the first flux path.

The base member 102 extends in a horizontal plane in the geometry of FIG. 1 and the first conductor axis 142 and the second coil axis 140 both extend in the horizontal plane. The skilled person will appreciate that the chosen designation of the top member and bottom member is arbitrary since a 180 degree rotation about the horizontal plane of the integrated magnetics component 100 would reverse the orientation of the top and bottom members without affecting the functionality of the component at all. In the depicted first embodiment of the invention each of the top and bottom members comprises a substantially quadratic flat plate structure with the first, second, third and fourth legs arranged in a substantially quadratic pattern at respective corners of the quadratic flat plate. The flat plate structure of the top member 104 is arranged substantially parallelly to the flat plate structure of the base member 102. The skilled person will appreciate that the base member and/or the top member each may have numerous different shapes such as rectangular, square, circular, elliptical, octagon etc.

The base member 102, including the first, second, third and fourth legs, 110, 112, 114 and 116, respectively, preferably comprises a material possessing high magnetic permeability such as a soft magnetic material like Ferrite or a ferromagnetic alloy like Sheet steel, Silicon steel, Cast steel, Tungsten steel Magnet steel, cast iron, Nickel etc. The same type of materials are suitable for the top member 104 such that each of the first and second magnetic flux paths exhibits low magnetic reluctance and preferably has high magnetic saturation points as well. The skilled person will also appreciate each of the first, second, third and fourth legs, 110, 112, 114 and 116, respectively, may have other cross-sectional profiles or shapes than the depicted circular shape such as triangular, quadratic, rectangular, elliptical, pentagon, hexagon, heptagon, octagon etc. The shape of each of the output inductor windings may be adapted to conform to these alternative cross-sectional profiles of the legs so as to fit tightly around a circumference of the leg in question.

An experimental prototype of the integrated magnetics component 100 in accordance with the present embodiment was built by the inventors with the following dimensions:

Base plate thickness, width and depth: 7 mm, 44 mm, 44 mm, respectively.

Length of each of the first, second, third and fourth legs=8 mm.

Diameter of each of the first, second, third and fourth legs=14 mm.

Base plate material and top member material: Mn—Zn ferrite MN80C.

Maximum power conversion capacity between 1 kW and 2 kW depending on the specifics of the application in question such as input voltage, output voltage, switching frequency etc of a power converter.

Figure 2:
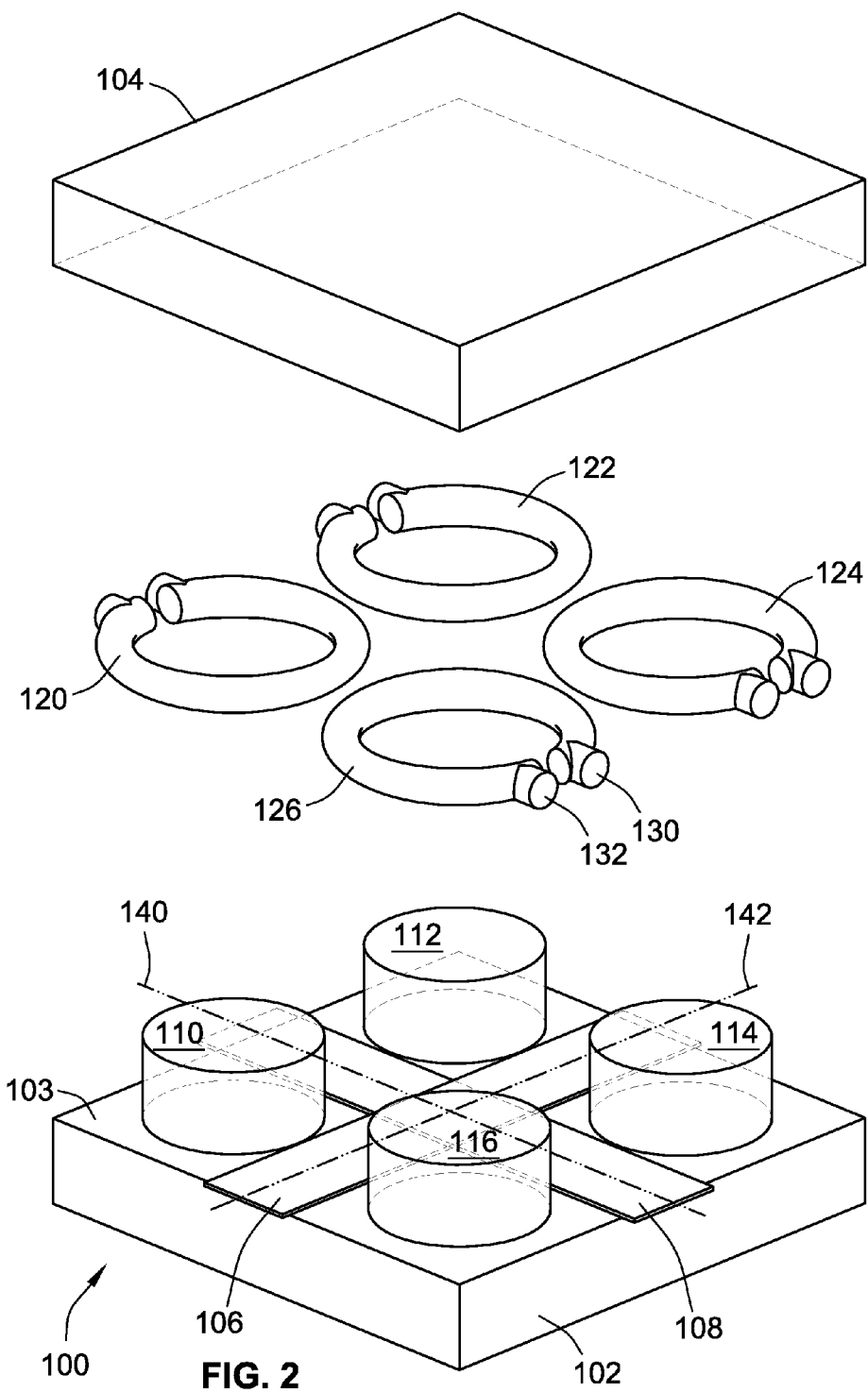
FIG. 2 shows an exploded perspective view of the integrated magnetics component in accordance with the first embodiment of the invention.

FIG. 2 shows an exploded perspective view of the integrated magnetics component 100 in accordance with the above-described first embodiment of the invention. The quadratic base member 102 is formed as a single unitary structure comprising a substantially quadratic flat plate structure with each of the first, second, third and fourth legs, 110, 112, 114 and 116, respectively, protruding substantially perpendicularly from the surface 103 of the flat plate. The first, second, third and fourth legs are situated at respective corners of the quadratic base member 102. The top member 104 has a mating shape to the base member is furthermore formed as a separate structure which is attached to the respective ends of the first, second, third and fourth legs, 110, 112, 114 and 116, respectively, by gluing/welding or by using adhesive tape or clamp recesses.

Figure 3:
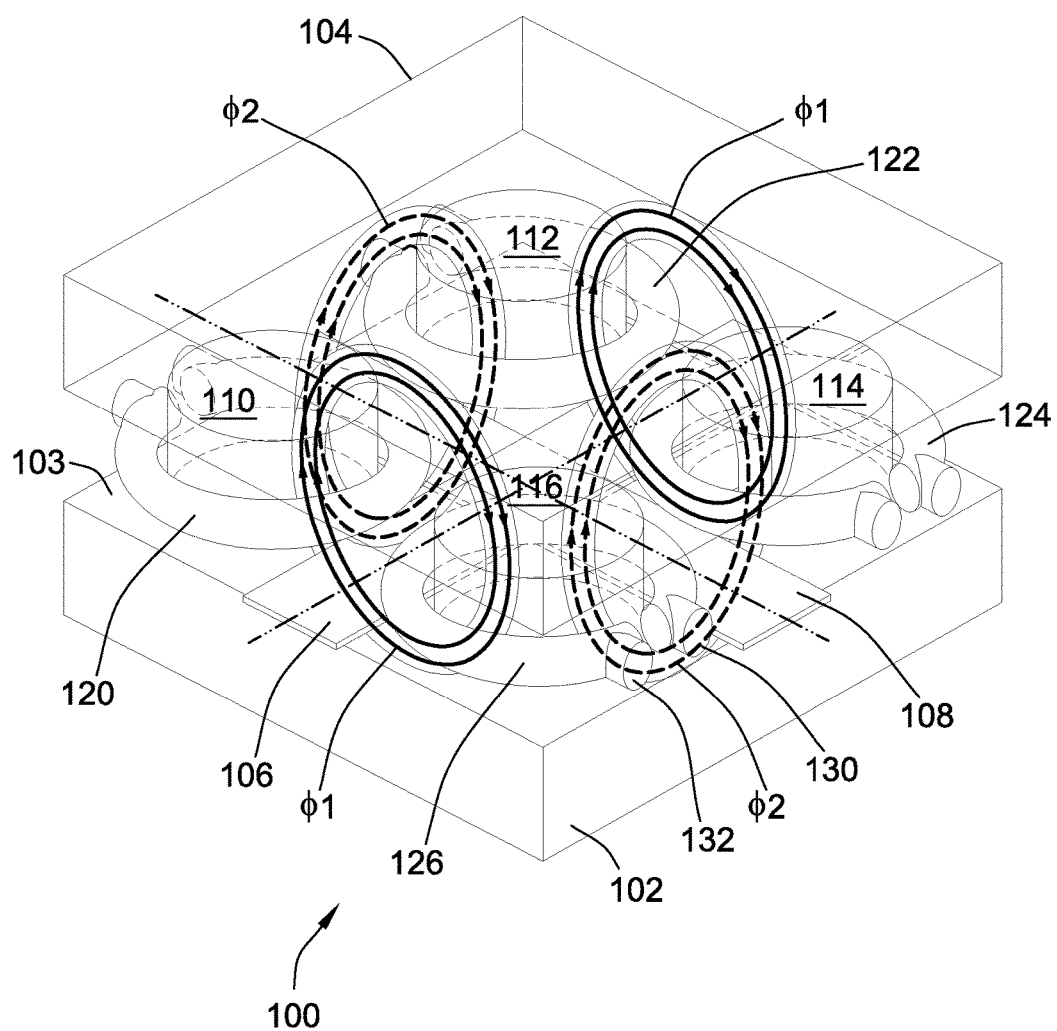
FIG. 3 illustrates schematically first and second orthogonally extending magnetic flux paths in a magnetically permeable core of the integrated magnetics component in accordance with the first embodiment of the invention.

FIG. 3 illustrates schematically the first and second orthogonally extending magnetic flux paths, $\phi 1$ and $\phi 2$, respectively, associated with the first and second input conductors 106, 108, respectively. The first and second orthogonally extending magnetic flux paths are schematically indicated by the circles in full lines and broken lines, respectively, running through the magnetically permeable core of the integrated magnetics component 100 designed in accordance with the first embodiment of the invention. The magnetic flux running through the first magnetic flux path $\phi 1$ is generated by input current flowing through the first input conductor 106. The first magnetic flux path $\phi 1$ forms a first closed magnetic loop or path extending from the base member portion below the first input conductor 106 and then vertically up through the first leg 110 and through the second leg 112, horizontally through the flat top plate 104 towards the third and fourth legs 114, 116 and vertically down through the third and fourth legs 114, 116 and horizontally through the flat plate structure of the base member returning to the base member portion situated below the first input conductor 106.

The magnetic flux running through the second magnetic flux path $\phi 2$ is generated by input current flowing through the second input conductor 108. The second magnetic flux path $\phi 2$ forms a second closed magnetic loop or path extending from the base member portion below the second input conductor 106 and then vertically up through the second leg 112 and through the third leg 114, horizontally through the flat top plate 104 towards the first and fourth legs 110, 116 and vertically down through these legs 114, 116 and horizontally through the flat plate structure of the base member 102 returning to the base member portion situated below the second input conductor 106. The skilled person will notice that an axis of the first magnetic flux path $\phi 1$ extends substantially orthogonally to an axis of the second magnetic flux path $\phi 2$.

Consequently, following the above analysis of the orientations of the first and second magnetic flux paths, input current flowing through the first input conductor 106 generates magnetic flux through each of the first, second, third and fourth legs, 110, 112, 114 and 116, respectively, and an input current flowing through the second input conductor 108, arranged orthogonally to the first input conductor, generates magnetic flux in each of the first, second, third and fourth legs, 110, 112, 114 and 116 respectively. A resulting magnetic flux in each of these legs depends on a magnitude and direction/phase of both of these input currents as discussed in further detail below in connection with FIGS. 7a)-d).

Figure 4:
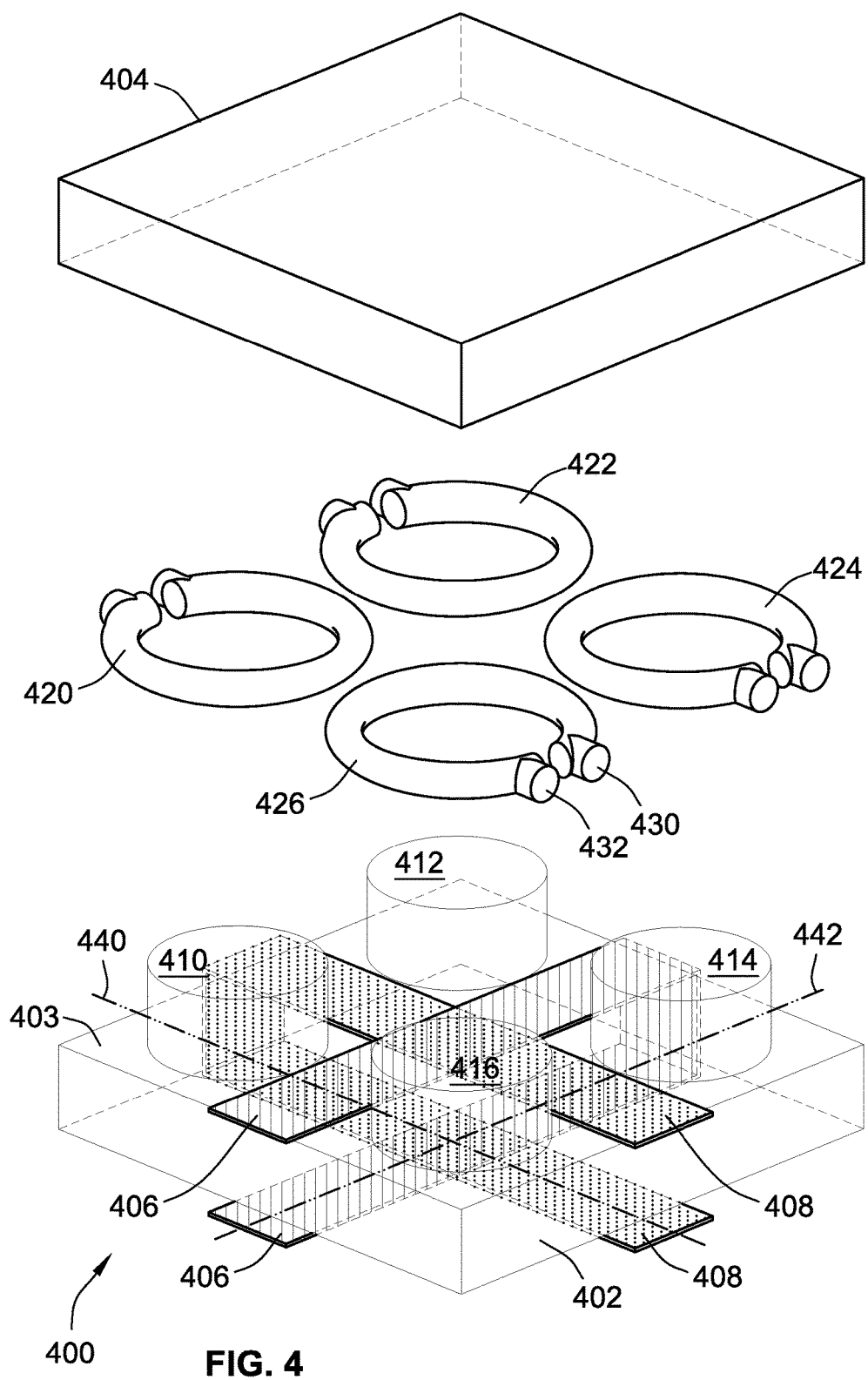
FIG. 4 shows an exploded perspective view of an integrated magnetics component in accordance with a second embodiment of the invention.

FIG. 4 shows an exploded perspective view of an integrated magnetics component 400 in accordance with a second embodiment of the invention. The reference numerals are numbered such that corresponding features of the first embodiment (FIG. 1) and the present embodiment 400 have corresponding designations. In the integrated magnetics component 400, the first input conductor extending in-between the first, second, third and fourth legs, 410, 412, 414 and 416, respectively, form part of a first single turn inductor winding 406. The single turn inductor winding 406 comprises a flat U-shaped ribbon or strip of electrically conductive material. The first input conductor is formed as a first leg or arm abutted or arranged proximate to an upper surface 403 of the base member 402. A second leg or arm of the first single turn inductor winding 406 is arranged below the flat quadratic structure of the base member 402 and parallelly with the first leg. A bridging or coupling portion of the single turn inductor winding 406 extends around an edge of the flat rectangular structure of the base member. The second leg and the bridging or coupling portion do not provide any noticeable contribution to the magnetic flux generated through a first magnetic flux path of the magnetically permeable core in response to a flow of input current through the single turn inductor winding 406.

A second input conductor is extending in-between the first, second, third and fourth legs, 410, 412, 414 and 416, respectively. The second input conductor forms part of a second single turn inductor winding 408 which is identical to the first single turn inductor winding 406. The second single turn inductor winding 408 comprises a flat U-shaped ribbon or strip of electrically conductive material in which the second input conductor forms a first leg or arm. The first leg of the second single turn inductor winding 408 is arranged orthogonally to the first leg of first single turn inductor winding 406 such that these are crossed in abutment at an upper surface 403 of the base member 402. The second single turn inductor winding 408 also comprises a second leg and bridging portion which do not provide any noticeable contribution to the magnetic flux generated through a second magnetic flux path of the magnetically permeable core in response to a flow of input current through the second single turn inductor winding 406. Hence, the respective magnetic fluxes generated by input currents flowing through the first and second single turn inductor windings 406, 408, respectively, are essentially similar to those described above in detail in connection with the first embodiment of the invention. In particular, the first magnetic flux path of the magnetically permeable core extends substantially orthogonally to the second magnetic flux path due to the orthogonal orientation of the first and second magnetic fields emanating from the flow of currents in the orthogonally oriented first and second input conductors. The skilled person will appreciate that each of the first and second single turn inductor windings 406, 408 in the alternative may comprises a plurality of full inductor windings such provide a plurality of parallelly extending first input conductors having input currents flowing in the same direction. The role of the second leg and bridging portion of the U-shaped strip of electrically conductive material is mainly to provide a current return path for multiple turns inductor windings. An advantage of the present embodiment of the first and second input conductors compared to the input conductors utilized in the previous embodiment is that the multiple turns provide a higher turns ratio of the transformer and lower magnetic core loss.

Figure 5:
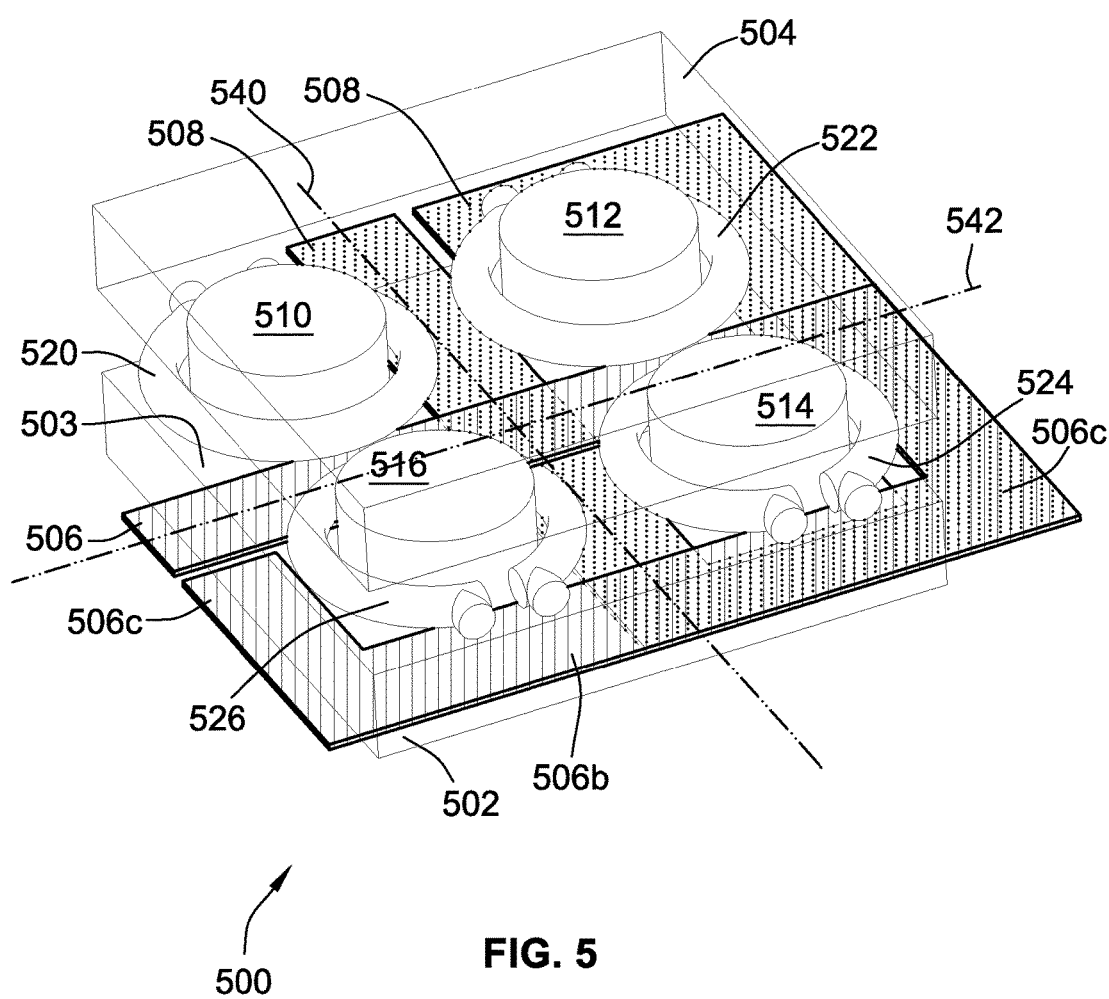
FIG. 5 shows an assembled view of the integrated magnetics component in accordance with a third embodiment of the invention.

FIG. 5 is an assembled perspective view of an integrated magnetics component 500 in accordance with a third embodiment of the invention. The reference numerals are designated such that corresponding features of the first embodiment (FIG. 1) and the present embodiment have corresponding numerals. The integrated magnetics component 500 comprises a base member 502 with a flat quadratic plate structure and a top member 504 which likewise has a substantially flat and quadratic plate like structure conforming to the outer contour of the base member 502. The top member 504 is firmly attached, and magnetically coupled, to opposite ends of first, second, third and fourth legs, 510, 512,514 and 516, respectively, relative to the base member 502 so as to form a coherent magnetically permeable core of the integrated magnetics component 500.

In the integrated magnetics component 500, a first input conductor forms part of a first inductor winding 506 which is formed as a single full turn winding. The first inductor winding 506 comprises a flat ribbon or strip of conductive material. However, instead of the U-shaped form used for the first inductor winding 506 in the second embodiment of the invention, the present first inductor winding 506 is folded in a horizontal plane extending along the upper surface 503 of the flat quadratic structure of a base member 502. In this manner, the first input inductor winding 506 extends exclusively above the base member 502 in the horizontal plane. However, the first input conductor is a straight flat strip of conductive material which forms a first leg or segment of the first inductor winding 506 and extends in-between the first, second, third and fourth legs, 510, 512, 514 and 516, respectively, of the integrated magnetics component 500 in a manner similar to the above discussed previous embodiments of the integrated magnetics component 500. The horizontally folded layout or geometry of the first input inductor winding 506 is wound around, or encircles, the fourth leg 516 and the third leg 514 which are arranged adjacently at the upper surface 503 of the base member 502. The horizontally folded layout or geometry of the first input conductor 506 forms a single full winding formed as a folded flat strip of winding with electrical terminals (not shown) arranged at end sections of the input inductor winding 506. The first input inductor winding 506 additionally comprises second leg 506b, which protrudes outside the periphery of the base member 505, and bridging or coupling portions 506c electrically and mechanically coupling the first and second legs. The second leg 506b and the bridging portion 506c do not provide any noticeable contribution to the magnetic flux generated through the first magnetic flux path of the magnetically permeable core. This is because these conductor portions/legs are magnetically coupled to the surrounding air with its low permeability and only very weakly coupled to the magnetically conductive material of the base member 502.

A second input inductor winding 508 of similar shape and material as the first input inductor winding 506 is arranged on the upper surface 503 of the flat quadratic structure of the base member 502, but oriented orthogonally to the first input conductor 506 in the horizontal plane. The horizontally folded layout or geometry of the second input inductor winding 508 is wound around, or encircles, the second leg 512 and the third leg 514 which are arranged adjacently at the upper surface 503 of the base member 502. The second input inductor winding 508 is arranged orthogonally to the first input inductor winding 506 and likewise comprises a first input conductor comprising a straight flat strip of conductive material extending in-between the first, second, third and fourth legs, 510, 512, 514 and 516, respectively. The first input conductor forms a first leg or segment of the first inductor winding 506. This orthogonal arrangement of the axes of the first and second input conductors leads to a corresponding orthogonal directions of the first and second magnetic fields generated in response to the flow of input currents through the first and second input conductors. Hence, the first magnetic flux path of the magnetically permeable core extends substantially orthogonally to the second magnetic flux path in a corresponding manner to FIG. 3 in respect of the magnetic flux paths φ1 and φ2.

An advantage of the present embodiment 500, compared to the first and second embodiments 100, 400, is that the geometry of the first and second input inductor windings 506, 508 make these well-adapted for integration on standard types of printed circuit boards (PCBs) for example flexible PCB or stiff PCB. This is feature enables modularization of a power converter based on the present embodiment of the integrated magnetics component 500 since other components of the power converter can be integrated on the PCB together with the input inductor windings 506, 508.

Figure 6:
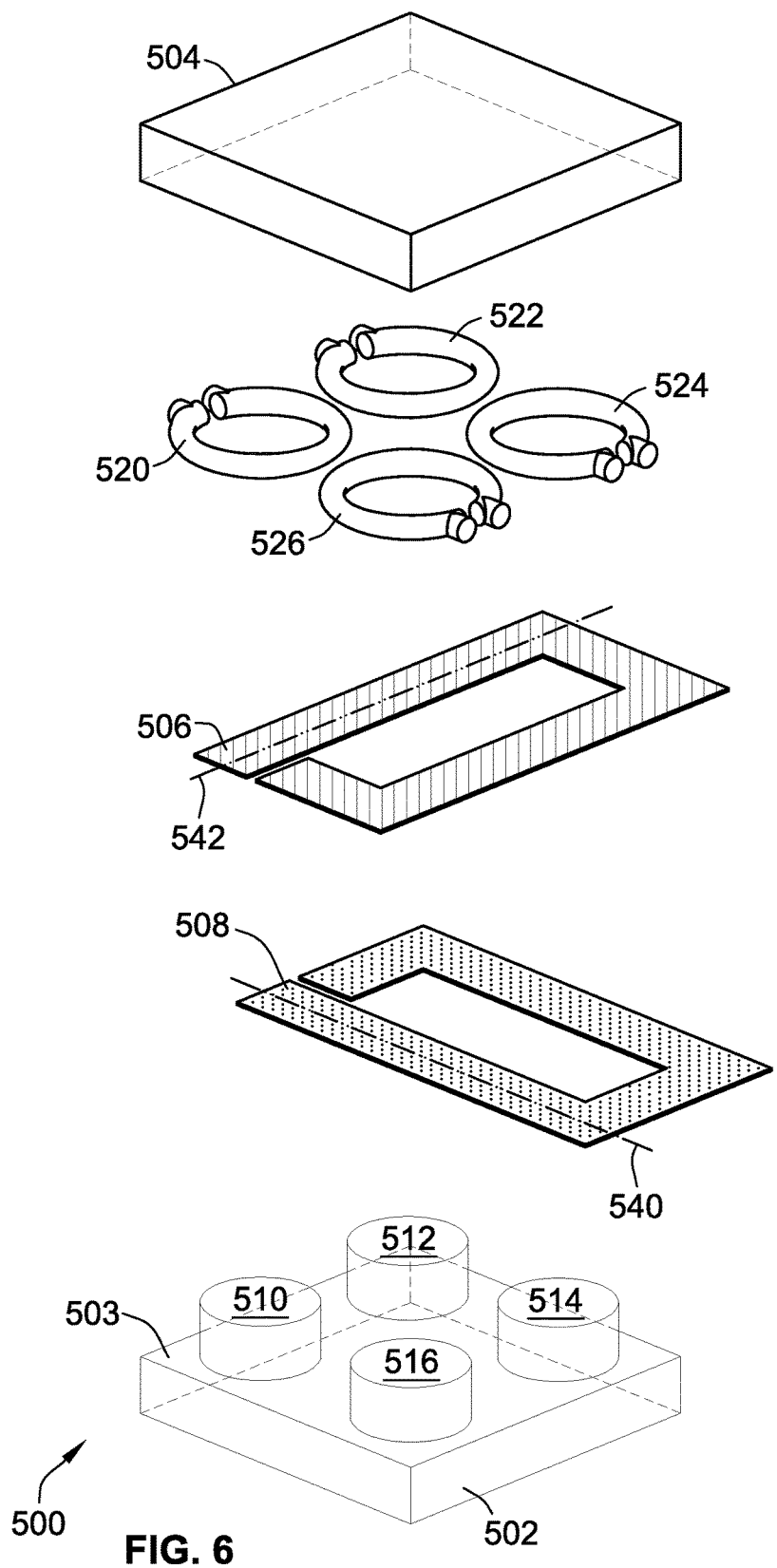
FIG. 6 shows an exploded perspective view of the integrated magnetics component in accordance with the third embodiment of the invention, FIGS. 7a), b), c) and d) illustrate respective magnetic flux directions through the four legs of the integrated magnetics component in accordance with the first embodiment of the invention for four different input current states.

FIG. 6 is an exploded perspective view of the integrated magnetics component 500 depicted above in accordance with the third embodiment of the invention. The horizontally folded layouts or geometries of the first and second inductor windings 506, 508 are evident such that the inductor windings are formed by respective flat folded strips of electrical conductors. Likewise, the figure depicts the orthogonal orientation in the horizontal plane of the first conductor axis 542, associated with the first input conductor 506, relative to the second coil axis 540, associated with the second input conductor 508.

FIG. 7a) illustrates respective magnetic flux directions through the first, second, third and fourth legs, 110, 112, 114 and 116, respectively, of the integrated magnetics component 100 in accordance with the first embodiment of the invention in a first input current state of four different input current states. The skilled person will appreciate that the respective magnetic flux directions through the first, second, third and fourth legs, 110, 112, 114 and 116, respectively, of the alternative embodiments of the integrated magnetics component 400, 500 are largely identical for the reasons discussed above. The first input current state is characterized by the indicated direction of the input current, I1, flowing through the first input conductor 106 and by the indicated direction of the input current, I2, flowing through the second input conductor 108. In the first input current state using the right hand rule, the input current I1 generates the first magnetic field which induces the magnetic fluxes indicated by solid arrows 109a and 109b in the same direction through the first leg 110 and the second leg 112. This is a consequence of the first leg 110 and the second leg 112 being arranged adjacently on the same side of the input conductor 106. Furthermore, the input current I1 also leads to the magnetic fluxes indicated by solid arrows 109c and 109c in the same direction in the third leg 114 and the fourth leg 116. The magnetic fluxes induced by I1 accordingly lead to oppositely directed magnetic fluxes through the first and second legs relative to the third and fourth legs which is a consequence of the geometry of the closed magnetic loop formed by the first magnetic flux path φ1 depicted on FIG. 3.

In the first input current state using the right hand rule on the indicated direction of the input current I2 flowing through the second input conductor 108 leads to the magnetic fluxes indicated by dotted arrows 111c and 111d in the same direction in the first leg 110 and the fourth leg 116. This is a consequence of the first leg 110 and the fourth leg 116 being arranged on the same side of the second input conductor 108. Furthermore, the input current I2 also leads to the magnetic fluxes indicated by dotted arrows 111b and 111a in the same direction in the second leg 112 and the third leg 114. The magnetic fluxes induced by I2 accordingly leads to oppositely directed magnetic fluxes in the first and fourth legs relative to the second and third legs which is a consequence of the geometry of the closed magnetic loop formed by the second magnetic flux path φ2 depicted on FIG. 3.

This analysis of the respective magnetic fluxes induced by input currents I1 and I2 reveals that a resulting magnetic flux in each of the first, second, third and fourth legs, 110, 112, 114 and 116, respectively, is determined by flux contributions or components from both the first magnetic flux path φ1 and the second magnetic flux path φ2. This implies that an output voltage induced in each of the output inductor windings 120,122, 124 and 126 likewise is determined by the contributions from both of the first and second magnetic flux paths.

FIG. 7b) illustrates respective magnetic flux directions through the first, second, third and fourth legs, 110, 112, 114 and 116, respectively, in a second input current state. In the depicted second input current state, the direction of the second input current I2 is reversed relative to the direction of I2 in the first input current state described above. The direction of the first input current I1 is the same as in the first input current state. These directions for the first and second input current leads to the depicted directions of the magnetic fluxes induced by I1 indicated by solid arrows 109a, 109b, 109c, 109d. Likewise, the respective magnetic fluxes through the legs induced by I2 are indicated by the dotted arrows 111a, 111b, 111c, 111d. As expected, the direction of the magnetic fluxes generated by I2 has been reversed through each of the first, second, third and fourth legs 110, 112, 114 and 116 while the direction of the magnetic fluxes generated by I2 has been maintained through each of the legs.

FIG. 7c) illustrates respective magnetic flux directions through the first, second, third and fourth legs 110, 112, 114 and 116, respectively, in a third input current state. In the depicted third input current state, the direction of both the first input current I1 and the second input current I2 have been reversed relative to their respective directions in the first input current state described above under FIG. 7a). These directions for the first and second input current leads to the depicted directions of the magnetic fluxes induced by I1 indicated by solid arrows 109a, 109b, 109c, 109d. Likewise, the respective magnetic fluxes through the legs induced by I2 are indicated by the dotted arrows 111a, 111b, 111c, 111d. As expected, the directions of all the induced magnetic fluxes have been reversed (relative to the first input current state) through each of the first, second, third and fourth legs, 110, 112, 114 and 116 due to the reversal of both input currents I1, I2.

FIG. 7d) illustrates respective magnetic flux directions through the first, second, third and fourth legs 110, 112, 114 and 116, respectively, in a fourth input current state. In the depicted fourth input current state, the direction of the first input current I1 is reversed relative to the direction of I1 in the first input current state described above in connection with FIG. 7a). These directions for the first and second input current leads to the depicted directions of the magnetic fluxes induced by I1 indicated by solid arrows 109a, 109b, 109c, 109d. Likewise, the respective magnetic fluxes through the legs induced by I2 are indicated by the dotted arrows 111a, 111b, 111c, 111d.

Figure 12A:
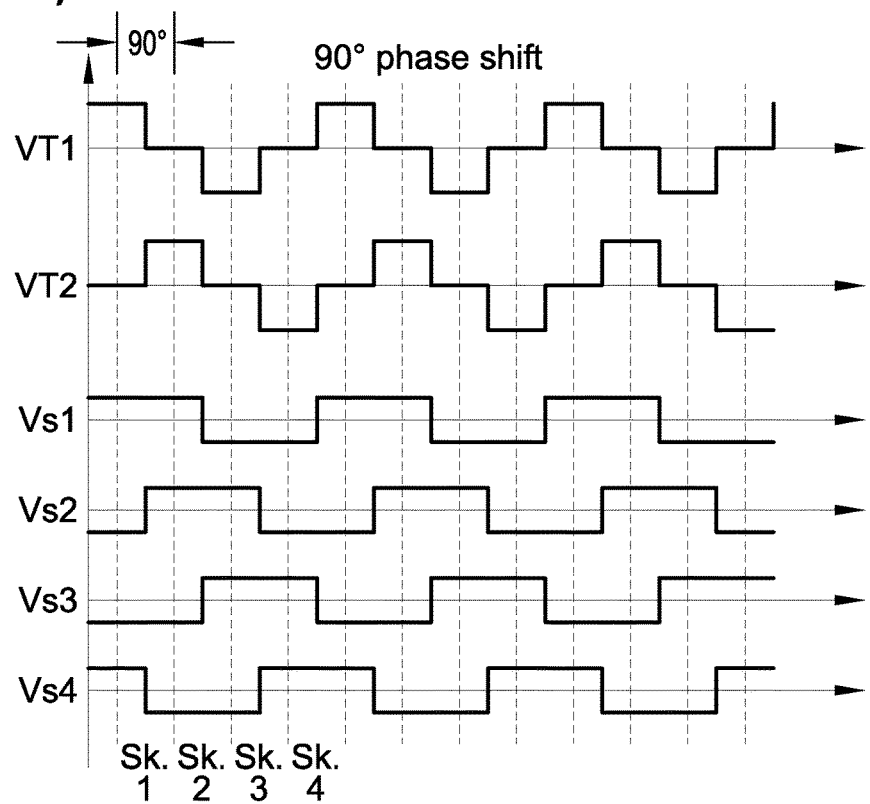
FIG. 12 shows two graphs depicting respective sets of simulated input and output voltage waveforms of a prototype dual-input isolated boost DC-DC converter for phase angle shifts between the first and second input voltage waveforms of 90 degrees and 0 degrees.
Figure 12B:
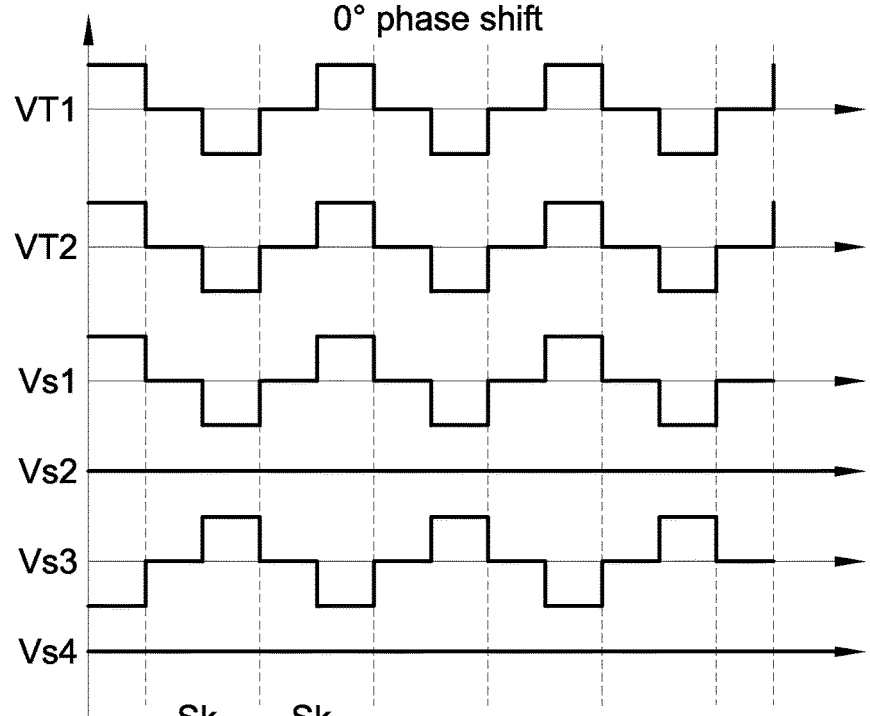

The above-described ability to alter a total or resulting magnetic flux through each of the first, second, third and fourth legs 110, 112, 114 and 116, respectively, depending on the directions or polarity of the first and second input or excitations currents flowing through the first and second input conductors 106, 108, respectively, leads to the possibility of producing different voltage waveforms on each of the output inductor windings 120,122, 124 and 126 by a relative shift of the voltage waveforms applied to the first and second input conductors 106, 108, respectively. Consequently, the output voltage of the output inductor windings 120,122, 124 and 126 can be adjusted by controlling a phase shift angle between the input voltage waveforms, and thus input currents I1 and I2, applied to the first and second input conductors 106, 108, respectively. This highly useful property is illustrated detail below in connection with FIG. 12 showing respective measured output voltage waveforms at each of the output inductor windings 120,122, 124 and 126 for different phase angle shifts between the first and second input voltage waveforms.

Figure 8:
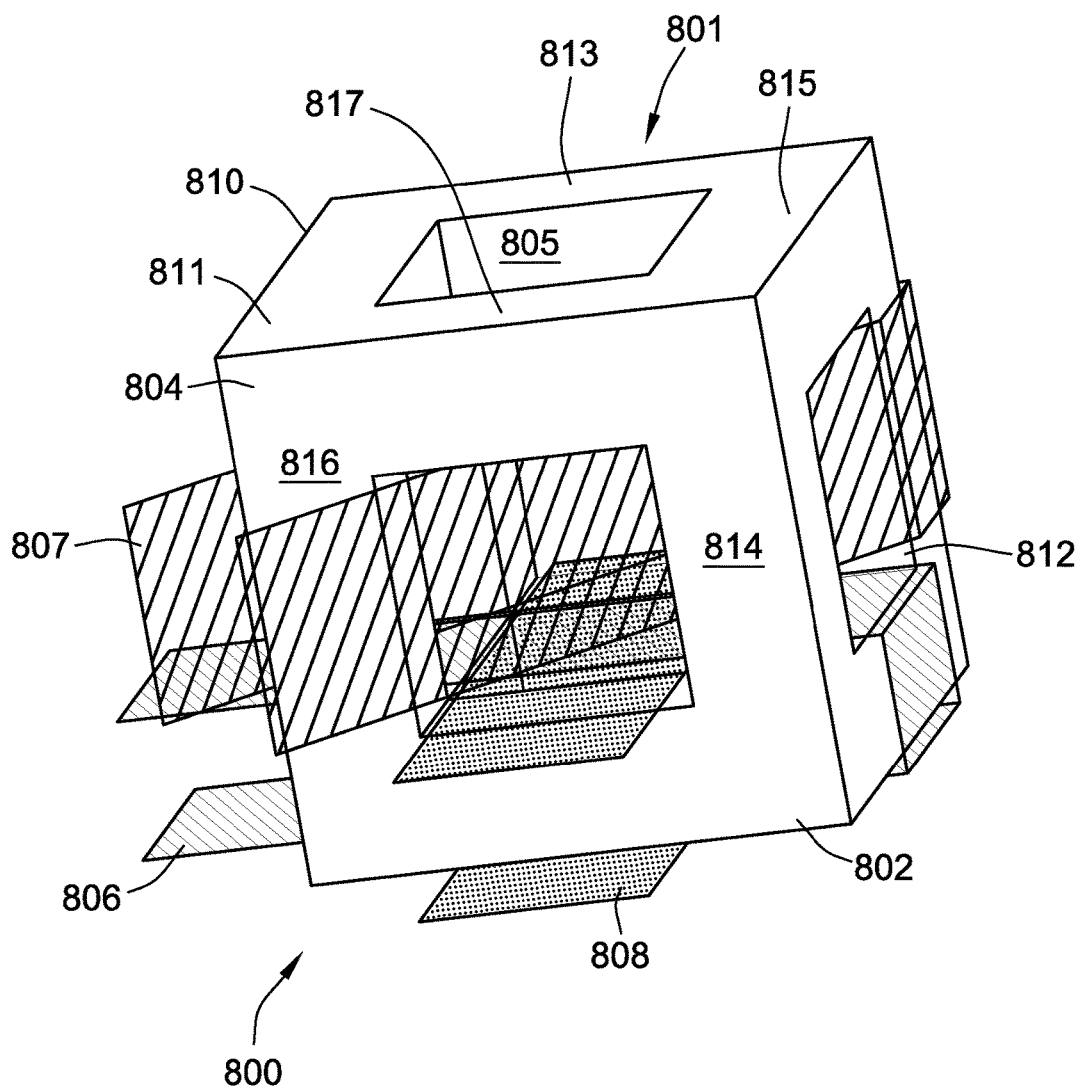
FIG. 8 shows an assembled perspective view of an integrated magnetics component comprising three input conductors in accordance with a fourth embodiment of the invention.

FIG. 8 shows an assembled perspective view of an integrated magnetics component 800 comprising three separate input conductors 806, 807, 808 in accordance with a fourth embodiment of the invention. The integrated magnetics component 800 comprises a magnetically permeable core which has a hollow cubic structure 801. The hollow cubic structure 801 comprises an integrally formed base member 802 and top member 804. The top member 804 has a centrally arranged quadratic cut-out or aperture 805 leading to the formation of a fifth leg 811, a sixth leg 813, a $7^{th}$ leg 815 and an $8^{th}$ leg 817 in the top member structure. In addition, a first leg 810, a second leg 812, a third leg 814 and a fourth leg 816 are protruding vertically from the base member 802. The first to $8^{th}$ legs are formed as respective vertices of the hollow cubic structure 801. The integrated magnetics component 800 furthermore comprises a first, a second, a third and a fourth output inductor winding wound around the first leg 810, the second leg 812, the third leg 814 and the fourth leg 816, respectively. In addition, the integrated magnetics component 800 comprises a fifth output inductor winding, a sixth output inductor winding, a $7^{th}$ output inductor winding and an $8^{th}$ output inductor winding wound around respective ones of the fifth leg 811, the sixth leg 813, the $7^{th}$ leg 815 and the $8^{th}$ leg 817. The first to $8^{th}$ output inductor windings are not depicted on the figure for the sake of clarity.

The first inductor winding 806 comprises a single full-turn winding formed as a flat U-shaped ribbon or strip of electrically conductive material. The flat U-shaped strip of conductive material 806 is similar to the U-shaped input conductor 406 described above in connection with the second embodiment of the invention in that it comprises a first input conductor formed as a leg or arm arranged proximate to an upper surface of the base member 802. The first input conductor extends in-between the first, second, third and fourth legs 810, 812, 814 and 816, respectively, which protrude from the base member 802 and form vertices of the hollow quadratic core 801. A second winding leg or arm of the flat U-shaped inductor winding 806 is arranged below the flat hollow quadratic structure of the base member 802. A bridging or coupling portion of the flat U-shaped strip 806 extends around an edge or vertices of the hollow rectangular structure of the base member. A second inductor winding 808 of similar shape, dimensions and material as the first inductor winding 806 is arranged or wound around the hollow quadratic structure of the base member 802 in the same manner as the first input conductor 806, but oriented orthogonally in the horizontal plane to the first inductor winding 806. A first leg of the second inductor winding 808 forms a second input conductor and also extends in-between the first, second, third and fourth legs 810, 812, 814 and 816, respectively, above the base member 802 such that the first and second input conductors overlap each other in a central region of the base member 802.

The integrated magnetics component 800 finally comprises a third input inductor winding 807 of similar shape, dimensions and material as the first and second input inductor windings 806, 808, respectively. The third input conductor is arranged or wound around the diagonally arranged second and fourth legs 812, 816, respectively, vertically off-set from the horizontal plane at the upper surface of the hollow quadratic structure of the base member 802. A first leg of the third inductor winding 807 form a third input conductor which extends in-between the first, second, third and fourth legs 810, 812, 814 and 816, respectively. The orientation of the third inductor winding is rotated 90 degrees about the horizontal plane relative to the orientation of the first and second inductor winding 806, 808, respectively. The third inductor winding 807 is configured to induce a third magnetic flux through a third flux path of the magnetically permeable core 801 in response to a third input current being applied thereto. This third input current leads to the formation of a third magnetic flux path which extends substantially orthogonally to a first flux path and substantially orthogonally to a second flux path in the magnetically permeable core 801 as explained in further detail below.

Figure 9:
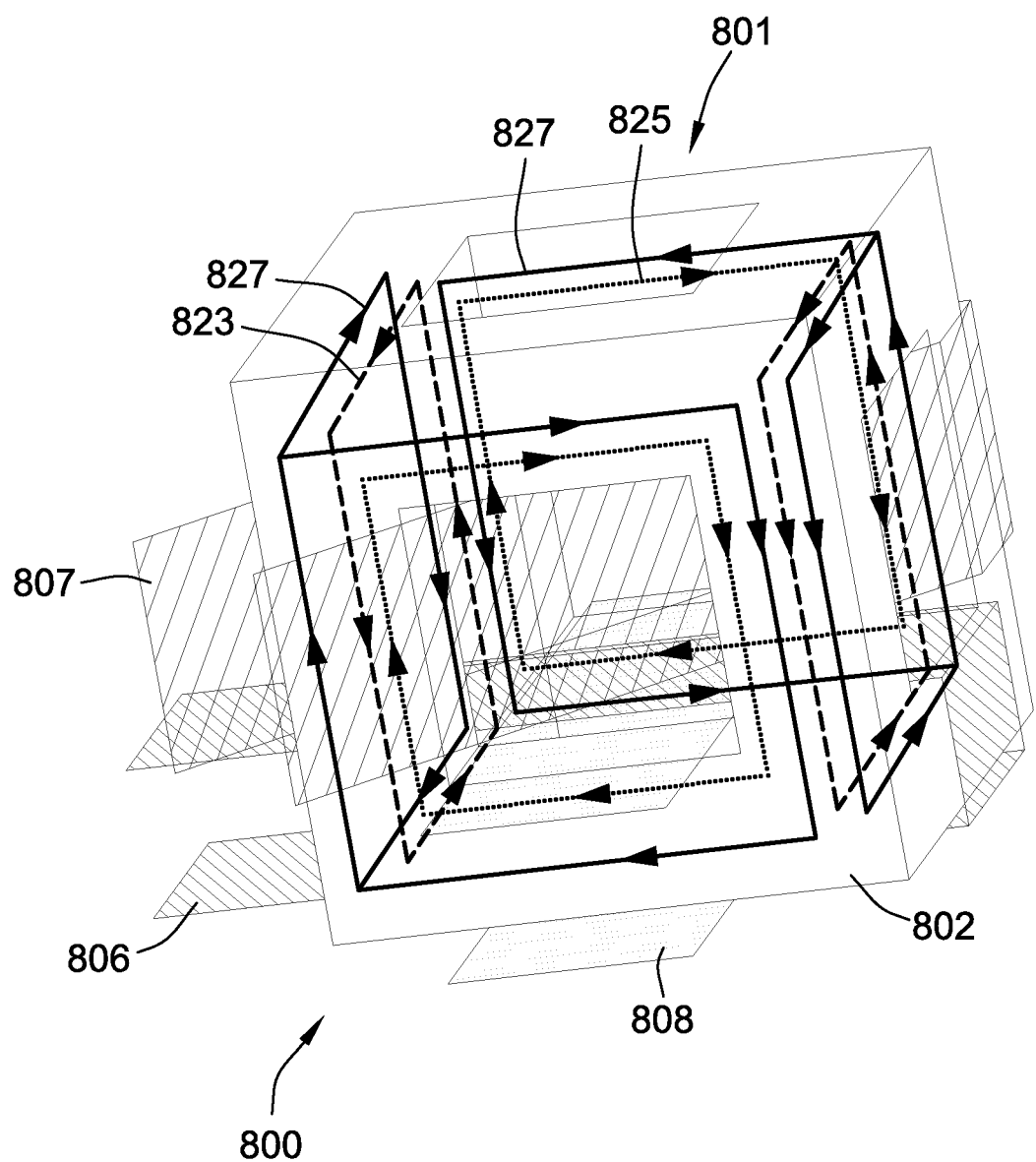
FIG. 9 illustrates schematically first, second and third orthogonally arranged magnetic flux paths in the core of the integrated magnetics component in accordance with the fourth embodiment of the invention.

FIG. 9 illustrates schematically first, second and third orthogonally arranged magnetic flux paths 823, 825 and 827, respectively, in the core 801 of the integrated magnetics component 800. The first magnetic flux path indicated by broken lines 823 conducts magnetic flux generated in response to the first input current being applied to the first input conductor 806 flowing from the top to the bottom or vice versa depending on a direction of the input current through the first input inductor 806. The second magnetic flux path indicated by dotted lines 825 conducts magnetic flux generated in response to the second input current being applied to the second input inductor 808 flowing from the top to the bottom or vice versa depending on the direction of the input current through the second input inductor 808. As illustrated, the first magnetic flux path 823 is arranged substantially orthogonally to the second magnetic flux path 825 in the sense that respective axes of the closed magnetic loops formed by these magnetic flux paths are substantially orthogonal. The third magnetic flux path indicated by the full lines 827 conducts magnetic flux generated in response to the third input current being applied to the third input conductor 807 flowing from a proximate to a distant vertical surface of the core 801 or vice versa depending on the direction of the input current through the third input inductor 807.

As illustrated, the third magnetic flux path 827 extends substantially orthogonally to the second magnetic flux path 825 and substantially orthogonally to the first magnetic flux path 823 leaving all three magnetic flux paths orthogonal to each other. This orthogonal arrangement of the first, second and third flux paths provides 3D orthogonal flux decoupling of the first, second and third input conductors and allow these to be operated independently substantially without any mutual magnetic coupling taking place such that three independent input voltage sources of a multiple-input power converter can be accommodated and work in unison to supply power to a common DC output voltage.

Figure 10:
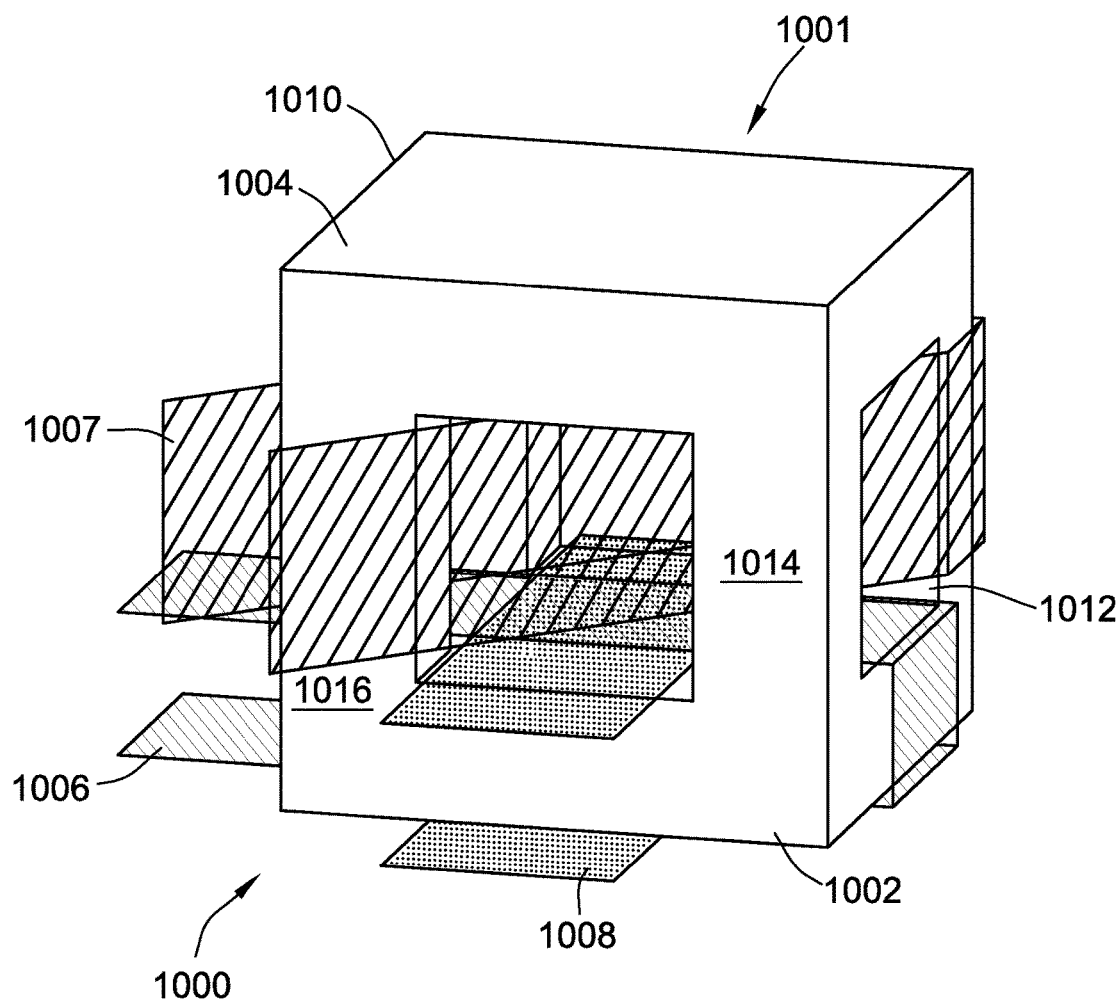
FIG. 10 shows an assembled perspective view of an integrated magnetics component comprising three input conductors in accordance with a fifth embodiment of the invention.

FIG. 10 shows an assembled perspective view of an integrated magnetics component 1000 comprising three separate input conductors 1006, 1007, 1008 in accordance with a fifth embodiment of the invention. The integrated magnetics component 1000 comprises a magnetically permeable core 1001 which has a hollow cubic structure. The hollow cubic structure 1001 comprises an integrally formed base member 1002 and top member 1004. The arrangement of the first, second and third input conductors 1006, 1008, 1007, respectively, on the magnetically permeable core 1001 is similar to the input conductor arrangement disclosed and discussed in detail above in connection with the fourth embodiment of the invention. Likewise, the shape, material and dimensions of the first, second and third input conductors 1006, 1008, 1007, respectively, may be identical to those discussed in detail above in connection with the fourth embodiment of the invention. However, while the top member of the previous embodiment comprised a centrally arranged quadratic aperture leading to the formation of 4 additional legs, the present top member is a solid plate like structure. The skilled person will appreciate that the hollow cubic core structure 1001 of the present embodiment is capable of supporting a corresponding set of three orthogonal magnetic flux paths as the first, second and third orthogonally arranged magnetic flux paths 823, 825 and 827, respectively, of the fourth embodiment of the integrated magnetics component 800. The integrated magnetics component 1000 furthermore preferably comprises at least a first, a second, a third and a fourth output inductor winding wound around the first leg 1010, the second leg 1012, the third leg 1014 and the fourth leg 1016, respectively. These output inductor windings have been left out of the figure for the sake of clarity.

Figure 11:
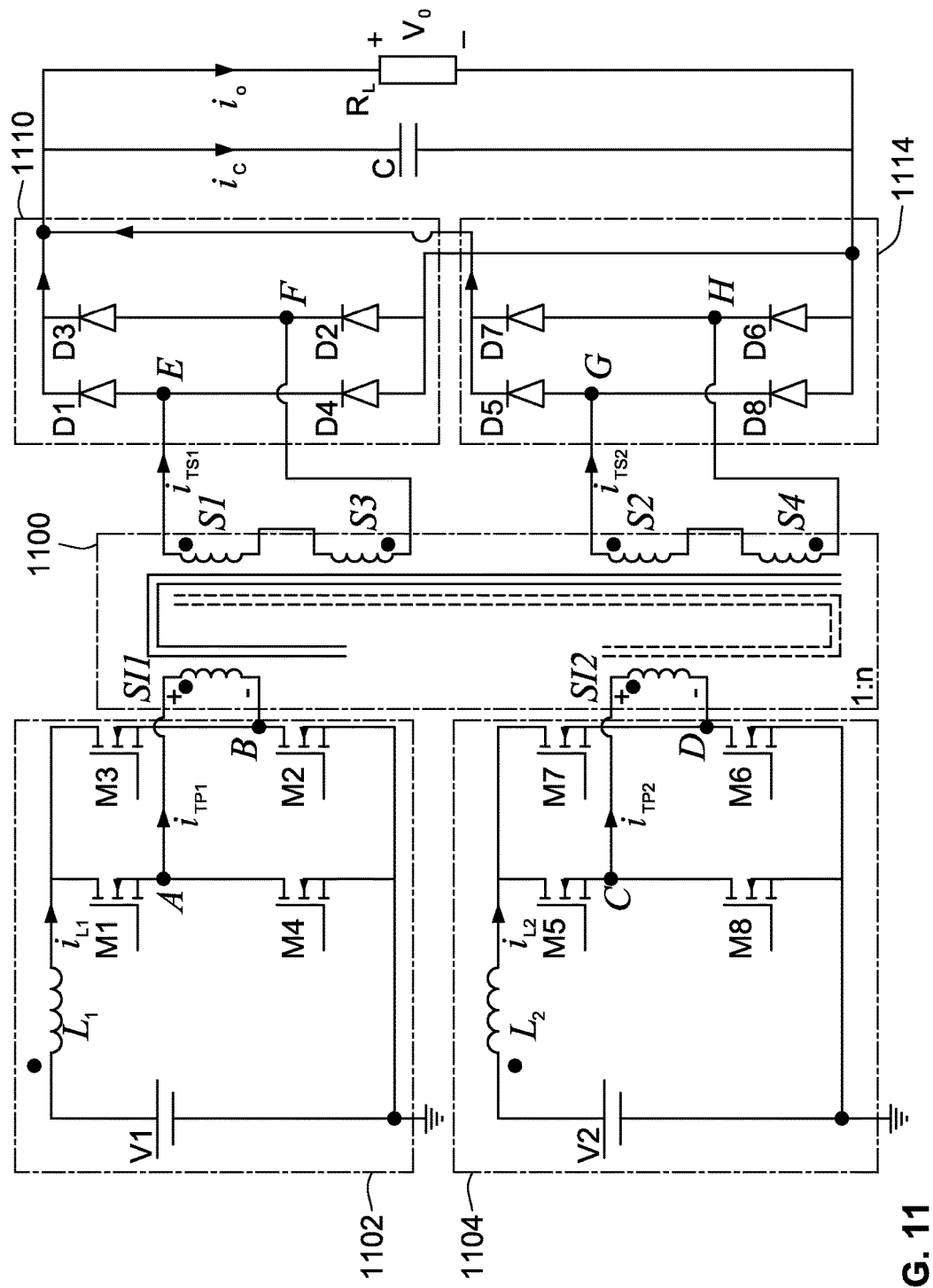
FIG. 11 is a schematic drawing of a dual-input isolated boost DC-DC converter comprising an integrated magnetics component in accordance with the first embodiment of the invention.

FIG. 11 is a schematic drawing of a dual-input isolated boost DC-DC converter comprising an integrated magnetics component 1100 in accordance with the first embodiment thereof. The integrated magnetics component 1100 acts as a transformer in the dual-input isolated boost DC-DC converter with the first and second input conductors SI1 and SI2, respectively, arranged at a primary transformer side and first, second, third and fourth output inductor windings S1-S4, respectively, arranged at a secondary transformer side. The skilled person will understand that the present integrated magnetics component 1100 could be replaced by an integrated magnetics component in accordance with any of the above-discussed second and third embodiments of the integrated magnetics component which both comprise a dual-input conductor architecture. In the alternative, the present integrated magnetics component 1100 could be replaced by the integrated magnetics component in accordance with any of the above-discussed fourth and fifth embodiments of the integrated magnetics component despite each of these comprises a three-input conductor configuration. However, anyone of the three input conductors may be left open without any connection to an input voltage source without compromising the operation of the integrated magnetics component during utilization of only the two residual input conductors. The turns ratio is 1:n as indicated on the figure where n may have a value between 0.1 to 100. The turns ratio being defined as the number of input conductors relative to the number of windings of an output inductor winding. Consequently, each of the first, second and third input conductors may have less, the same or more conductors than the number of windings of each of the output inductor windings.

The dual-input isolated boost DC-DC converter comprises a first input driver 1102 electrically coupled to the first input conductor SI1 to supply a first drive signal thereto and a second input driver 1104 electrically coupled to the second input conductor SI2 to supply a second drive signal thereto. A first output inductor winding S1 corresponding to the first winding 120 of FIG. 1 is coupled in series with a second output inductor winding S3, for example corresponding to the third output winding 124 of FIG. 1, such that S1 and S3 are wound around diagonally arranged legs of the integrated magnetics component 1100. Respective end terminals of S1 and S3 are electrically coupled to a first output rectification circuit 1110 at circuit nodes E and F, respectively. A third output inductor winding S2, corresponding to the second output winding 122 of FIG. 1, is coupled in series with a fourth output inductor winding S4, for example corresponding to the fourth output winding 126 of FIG. 1, such that S2 and S4 are wound around respective diagonally arranged legs of the integrated magnetics component 1100. Respective end terminals of S2 and S4 are electrically coupled to a second output rectification circuit 1114 at circuit nodes G and H, respectively. The first and second output rectification circuits 1110, 1114, respectively, each comprises a full-wave diode rectifier. The full-wave diode rectifier of the first output rectification circuit 1110 comprises semiconductor diodes D1, D2, D3 and D4 while the full-wave diode rectifier of the second output rectification circuit 1114 comprises semiconductor diodes D5, D6, D7 and D8. The first and second output rectification circuits 1110, 1114, respectively, are coupled in parallel to a DC output voltage node at $V_o$. A load on the dual-input isolated boost DC-DC converter is schematically indicated by a load resistance $R_L$. An output capacitor C is coupled across the a DC output voltage node to suppress voltage ripple in the rectified voltage waveforms supplied by the first and second output rectification circuits 1110, 1114, respectively, and provide a stable low-ripple DC output voltage.

The first input driver 1102 comprises an H-bridge transistor driver coupled to a first input voltage, V1, which for example may be a DC voltage between 5 Volt and 100 Volt, through a first boost inductor $L_1$. Complementary output nodes, node A and node B respectively, of the first H-bridge transistor driver are electrically coupled to opposite ends of the first input conductor Si1. The second input driver 1104 comprises an H-bridge transistor driver coupled to a second input voltage, V2, which for example may be a DC voltage between 5 Volt and 100 Volt, through a second boost inductor $L_2$. Complementary output nodes, node C and node D, of the second H-bridge transistor driver are electrically coupled to opposite ends of the second input conductor SI2.

As previously explained, the orthogonal arrangement of the first and second flux paths associated with the first and second input conductors, SI1 and SI2, respectively, within the magnetically permeable core of the integrated magnetics component 1100 provides 2-dimensional (2D) (or even 3D) orthogonal flux decoupling of the first and second input conductors and allow these to be operated independently such that the input voltage sources V1 and V2 can be coupled to a common electrical potential like ground as indicated on FIG. 11. The magnetic flux generated or induced by the input current flowing through the first input conductor SI1 induces substantially zero magnetic flux in the second input conductor SI2 since the magnetic flux or field generated by SI1 runs parallelly with the input conductor axis of SI2 in the magnetically permeable core and vice versa as explained above e.g. in connection with FIG. 3.

In FIG. 12, the uppermost graph a) depicts a first set of simulated input and output voltage waveforms of a prototype dual-input isolated boost DC-DC converter for phase angle shifts between the first and second input voltage waveforms of 90 degrees. The first and second input voltage waveforms are applied to respective ones of the first and second input conductors SI1, SI2 as first and second the PWM modulated drive signals. The duty cycle of the PWM modulated first and second drive signals was fixed at 75%.

Graph a) depicts, for a phase shift angle of 90 degrees, the first and second drive signal waveforms, $V_{T1}$ and $V_{T2}$, respectively, applied to first and second input conductors SI1 and SI2. The respective output signal waveforms $V_{S1}$, $V_{S2}$, $V_{S3}$ and $V_{S4}$ induced in the first, second, third and fourth output inductor windings 120, 122, 124 and 126, respectively, are plotted below. Likewise, graph b) of FIG. 12, depicts, for a phase shift angle of 0 degree, the first and second drive signal waveforms, $V_{T1}$ and $V_{T2}$, respectively, applied to first and second input conductors SI1 and SI2. The respective output signal waveforms $V_{S1}$, $V_{S2}$, $V_{S3}$ and $V_{S4}$ induced in the first, second, third and fourth output inductor winding 120, 122, 124 and 126, respectively, in response thereto are plotted below.

Figures 13A, 13B:
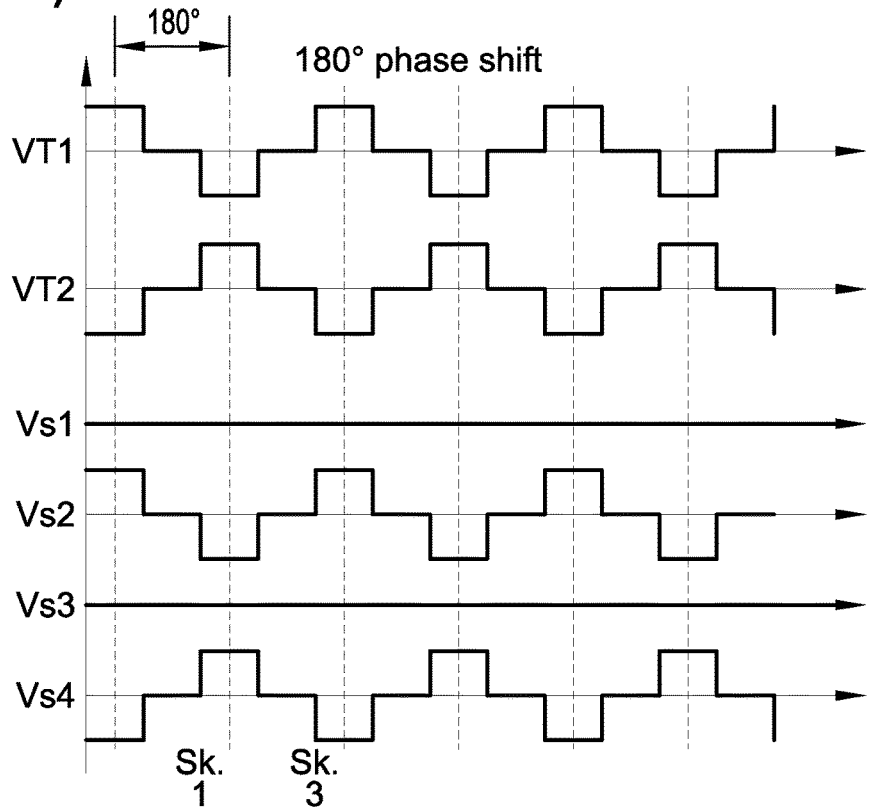
FIG. 13 shows two graphs depicting respective sets of simulated input and output voltage waveforms of a prototype dual-input isolated boost DC-DC converter for phase angle shifts between the first and second input voltage waveforms of 180 degrees and 45 degrees.

Finally, graph a) and b) of FIG. 13, depicts, for phase shift angle of 180 degrees and 45 degrees, respectively, the first and second drive signal waveforms, $V_{T1}$ and $V_{T2}$, respectively, applied to first and second input conductors SI1 and SI2. The respective output signal waveforms $V_{S1}$, $V_{S2}$, $V_{S3}$ and $V_{S4}$ induced in the first, second, third and fourth output inductor winding 120, 122, 124 and 126, respectively, in response thereto under each phase shift angle are plotted below the drive signal waveforms. As illustrated the respective output signal waveforms $V_{S1}$, $V_{S2}$, $V_{S3}$ and $V_{S4}$ can be adjusted by adjusting the phase shift angle between the first and second drive signal waveforms, $V_{T1}$ and $V_{T2}$ Maximum DC output voltage is produced when the phase shift angle is 0 or 180 degrees while minimum DC output voltage is produced for 90 degrees phase angle shift. In addition, the DC output voltage can also be controlled by adjusting the duty cycle of the PWM modulated first and second drive signal. This is contrary to traditional power converters where the DC output voltage is adjusted solely by duty cycle control of a PWM input signal.

Furthermore, a multi-level output voltage waveform is produced in each of the output signal waveforms $V_{S1}$, $V_{S2}$, $V_{S3}$ and $V_{S4}$ for a phase shift angle of 45 degrees between the first and second drive signal waveforms as illustrated on FIG. 13 b). The multi-level output voltage waveforms demonstrate an interesting potential for new topologies of multi-level power converters that could replace traditional diode clamped cascaded and capacitor clamped multi-level converter topologies. One advantage of the generated multi-level output voltage waveform is that peak current through each of the MOSFETs M1-M4 of the first input driver 1102 and peak current through each of the MOSFETs M5-M8 of second input driver 1104 is reduced. Likewise, peak currents induced in each of the first and second input conductors and in the output inductor windings can be significantly reduced due to the multi-level waveforms generated by the 45 degree phase shift angle setting. This feature also leads to a higher conversion efficiency of power converter.

Another advantage of the present power converter is the ability to generate pure rectangular pulse waveforms at 50% duty cycle of the PWM modulated input signals without inducing any intermittent zero voltage levels or platforms on each of the first output inductor winding S1, second output inductor winding S3, third output inductor winding S3 and fourth output inductor winding S4. The rectangular pulse waveforms are generated when the phase shift angle between the first and second drive signal waveforms is 90 degrees and can ideally achieve zero voltage ripple at the DC output voltage even in the absence of an output filter. This requires that diagonally arranged output inductor windings on the legs of the base member are coupled in series on the secondary side of the integrated magnetic component (which acts like a transformer).

REFERENCES

[1] Y-C. Liu, Y-M. Chen, "A systematic approach to synthesizing multi-input dc-dc conveners," *IEEE Transactions* 011 *Power Electron.*, vol. 24, no. I, pp. 6-127, January 2009.

[2] K. Kobayashi, H. Matsuo. And Y. Sekinc, "Novel solar-cell power supply system using a multiple-input DC-DC convener." *IEEE Trans. Ind. Elektron.*, vol. 53, no. I, pp. 281-286. February 2006.

[3] H. Matsuo, T. Shigemizu, F. Kurokawa, N. Watanabe, "Characteristics of the multiple-input de-de convener," *IEEE Transactions* 011 *Ind. Electron.*, vol. SI, no. 3. pp. 625-631, June 2004.

[4] K. P. Yalanmanchili, M. Ferdowsi. "Review of multiple input dc-dc converters for electric and hybrid vehicles," *IEEE Vehicle Power and Propulsion Co11jere11ce*, pp. 160-163, 7-9 Se pt. 2005.

[5] Y-M. Chen, Y-C. Liu and F-Y. Wu. "Multi-input de/de converter based on the multi-winding transformer for renewable energy applications", *IEEE Transactions On industry Appl.* vol. 38, no. 4, pp. I 096-II 04, July 2002.

[6] S. S. Ochi and E. H. Wittenbreder, "Integrated multi-transformer" US patent, US20090230776A1.

[7] F. Zhang, F. Peng, and Z. Qian, "Study of the multilevel conveners in dc-dc applications" in *Proc. IEEE PESC*, pp. I702-1 706, 2004.

[8] M. Nymand, 'Switch mode pulse width modulated dc-dc convener with multiple power transformers: WO/2009/012778. International Patent Application PCT/DK 2008/000274.

The invention claimed is:
1. An integrated magnetics component comprising:
a magnetically permeable core comprising a base member and a top member, the base member extending in a horizontal plane and comprises first, second, third and fourth legs protruding substantially perpendicularly from the base member;
the top member being attached to opposite ends of the first, second, third and fourth legs relative to the base member;
a first output inductor winding wound around the first leg, a second output inductor winding wound around the second leg, a third output conductor winding wound around the third leg, and a fourth output inductor winding wound around the fourth leg;

a first input conductor extending in-between the first, second, third and fourth legs along a first conductor axis, said first input conductor configured to induce a first magnetic field orthogonally to the first conductor axis and extending through a first flux path of the magnetically permeable core; and a second input conductor extending along a second conductor axis and arranged to induce a second magnetic field orthogonally to the second conductor axis and extending through a second flux path of the magnetically permeable core, wherein the second flux path extends substantially orthogonally to the first flux path.

2. An integrated magnetics component according to claim 1, wherein the first conductor axis and the second conductor axis both extend in, or in parallel with, the horizontal plane.

3. An integrated magnetics component according to claim 1, comprising a third input conductor extending in-between a diagonal pair of the first, second, third and fourth legs along a third conductor axis to induce a third magnetic field orthogonally to the third conductor axis;

wherein the third input conductor is arranged to generate the third magnetic field through a third flux path of the magnetically permeable core extending substantially orthogonally to the first flux path and substantially orthogonally to the second flux path of the magnetically permeable core.

4. An integrated magnetics component according to claim 3, wherein the top member comprises a first central through-going cut-out to form fifth, sixth, $7^{th}$ and $8^{th}$ legs extending parallel to the horizontal plane.

5. An integrated magnetic component according to claim 4, wherein the base member comprises a second central through-going cut-out to from $9^{th}$, $10^{th}$, $11^{th}$ and $12^{th}$ legs extending parallel to the horizontal plane.

6. An integrated magnetics component according to claim 1, wherein the first, second, third and fourth legs are arranged in a substantially rectangular or quadratic pattern on the base member.

7. An integrated magnetics component according to claim 6, wherein the base member comprises a first substantially flat rectangular or quadratic plate with the first, second, third and fourth legs situated at respective corners of the first flat plate.

8. An integrated magnetics component according to claim 7, wherein each of the first, second, third and fourth legs is flush mounted with respective edges of the first substantially flat rectangular or quadratic plate.

9. An integrated magnetics component according to claim 8, wherein the top member comprises a second substantially flat rectangular or quadratic plate shaped such that the first, second, third and fourth legs are flush mounted to respective edges of the second flat plate.

10. An integrated magnetics component according to claim 6, wherein the top member, the base member and the first, second, third and fourth legs form a hollow cubic structure wherein the first, second, third, fourth, fifth, sixth, $7^{th}$, $8^{th}$, $9^{th}$, $10^{th}$, $11^{th}$ and $12^{th}$ legs form respective vertices of the hollow cubic structure.

11. An integrated magnetics component according to claim 1, wherein;

the first, second, third and fourth legs are arranged at respective positions of the base member such that first and second substantially orthogonally extending trenches or passages are formed at a surface of the base member; and the first and second input conductors projecting through the first trench or passage and the second trench or passage, respectively.

12. An integrated magnetics component according to claim 11, wherein the first and second input conductors are abutted and overlapped in a central region of the base member.

13. An integrated magnetics component according to claim 1, wherein:

the first input conductor forms part of a first inductor winding wound around the base member or wound around the top member; and the second input conductor forms part of a second inductor winding wound around the base member or wound around the top member.

14. An integrated magnetics component according to claim 1 wherein:

the first input conductor forms part of a first input inductor winding wound around a first pair of adjacent legs of the first, second, third and fourth legs; and the second input conductor forms part of a second input inductor winding wound around a second pair of adjacent legs of the first, second, third and fourth legs;

wherein each of the first and second inductor windings extend exclusively above the base member or above the top member in, or parallel to, the horizontal plane.

15. An integrated magnetics component according claim 1, wherein the first and second input conductors comprise respective substantially straight segments of electrically conductive wire.

16. An integrated magnetics component according to claim 15, wherein:

the first and second straight segments of electrically conductive wire comprise respective flat strips of electrically insulated conductor material arranged in abutment with the base member or in abutment with the top member.

17. An integrated magnetics component according to claim 1, wherein:

the first input conductor is configured to generate magnetic fluxes in a first direction through a first pair of adjacent legs arranged on a first side of the first input conductor and oppositely directed magnetic fluxes through a second pair of adjacent legs arranged on a second and opposite side of the first input conductor; and the second input conductor is configured to generate magnetic fluxes in a second direction through a first pair of adjacent legs arranged on a first side of the second input conductor and oppositely directed magnetic fluxes through a second pair of adjacent legs arranged on a second and opposite side of the second input conductor.

18. An integrated magnetics component according to claim 1, wherein:

the first flux path forms a first closed magnetic loop extending from the first input conductor through the base member, the first and second legs, the top member, the third and fourth legs and back to the first input conductor; and the second flux path forms a second closed magnetic loop extending from the second input conductor through the base member, the first and fourth legs, the top member, the second and third legs and back to the second input conductor, wherein an axis of the first closed magnetic loop extends substantially orthogonally to an axis of the second closed magnetic loop.

* * * * *